US008288743B2

(12) United States Patent
Ueno et al.

(10) Patent No.: US 8,288,743 B2
(45) Date of Patent: Oct. 16, 2012

(54) APPARATUS FOR AND METHOD OF WITHDRAWING IONS IN EUV LIGHT PRODUCTION APPARATUS

(75) Inventors: Yoshifumi Ueno, Hiratsuka (JP); Osamu Wakabayashi, Hiratsuka (JP); Tamotsu Abe, Odawara (JP); Akira Sumitani, Isehara (JP); Hideo Hoshino, Hiratsuka (JP); Akira Endo, Tokyo (JP); Georg Soumagne, Kamakura (JP)

(73) Assignee: Gigaphoton, Inc., Oyama-shi (JP)

( * ) Notice: Subject to any disclaimer, the term of this patent is extended or adjusted under 35 U.S.C. 154(b) by 253 days.

(21) Appl. No.: 12/406,388

(22) Filed: Mar. 18, 2009

(65) Prior Publication Data
US 2009/0261242 A1 Oct. 22, 2009

(30) Foreign Application Priority Data

Apr. 16, 2008 (JP) ................... 2008-106907

(51) Int. Cl.
*B01D 59/44* (2006.01)
(52) U.S. Cl. ................ 250/504 R; 250/432 R; 250/424; 250/425
(58) Field of Classification Search .................. None
See application file for complete search history.

(56) References Cited

U.S. PATENT DOCUMENTS

| | | | |
|---|---|---|---|
| 6,987,279 B2 * | 1/2006 | Hoshino et al. | 250/504 R |
| 7,297,968 B2 * | 11/2007 | Endo et al. | 250/504 R |
| 2005/0167618 A1 * | 8/2005 | Hoshino et al. | 250/504 R |
| 2005/0279934 A1 * | 12/2005 | Stewart et al. | 250/310 |
| 2005/0279946 A1 * | 12/2005 | Rettig et al. | 250/396 ML |
| 2006/0091109 A1 | 5/2006 | Partlo | |
| 2006/0186356 A1 * | 8/2006 | Imai et al. | 250/504 R |
| 2006/0249698 A1 * | 11/2006 | Endo et al. | 250/504 R |
| 2007/0064747 A1 * | 3/2007 | Feve et al. | 372/10 |
| 2007/0114470 A1 * | 5/2007 | Bowering | 250/504 R |
| 2007/0228298 A1 * | 10/2007 | Komori et al. | 250/493.1 |

(Continued)

FOREIGN PATENT DOCUMENTS

JP  2004-327213  11/2004

(Continued)

OTHER PUBLICATIONS

Notification of Reasons for Refusal received in counterpart application No. 2008-106907 from the Japanese Patent Office mailed May 15, 2012 with English translation (5 pages).

*Primary Examiner* — Michael Logie
(74) *Attorney, Agent, or Firm* — Kratz, Quintos & Hanson, LLP

(57) ABSTRACT

An ion withdrawal apparatus that withdraws ions emitted from a plasma in an EUV light production apparatus in which a target at an EUV light production point is irradiated with laser light to be made in a plasma state and the target emits EUV light, the ion withdrawal apparatus which includes: a collector mirror that is disposed in a direction opposite to a laser light incidence direction to collect the EUV light and has a hole for the ions to pass therethrough; magnetic line of force production means that produces a magnetic line of force that is parallel or approximately parallel to the laser light incidence direction at or in the vicinity of the EUV light production point; and ion withdrawal means that is disposed on the opposite side of the collector mirror from the EUV light production point and withdraws the ions.

21 Claims, 15 Drawing Sheets

FIRST EMBODIMENT

U.S. PATENT DOCUMENTS

| | | | |
|---|---|---|---|
| 2008/0029717 A1* | 2/2008 | Shirai | 250/504 R |
| 2008/0035865 A1* | 2/2008 | Komori et al. | 250/504 R |
| 2008/0083887 A1* | 4/2008 | Komori et al. | 250/504 R |
| 2008/0180029 A1* | 7/2008 | Hergenhan et al. | 315/111.21 |
| 2008/0237501 A1* | 10/2008 | Hosokai et al. | 250/504 R |
| 2010/0051827 A1* | 3/2010 | Derra et al. | 250/492.1 |

FOREIGN PATENT DOCUMENTS

| | | |
|---|---|---|
| JP | 2005-032510 | 2/2005 |
| JP | 2005-197456 A1 | 7/2005 |
| JP | 2006-080255 | 3/2006 |
| WO | WO 02/46839 A2 | 6/2002 |

* cited by examiner

THIRD EMBODIMENT

FIFTH EMBODIMENT

SIXTH EMBODIMENT

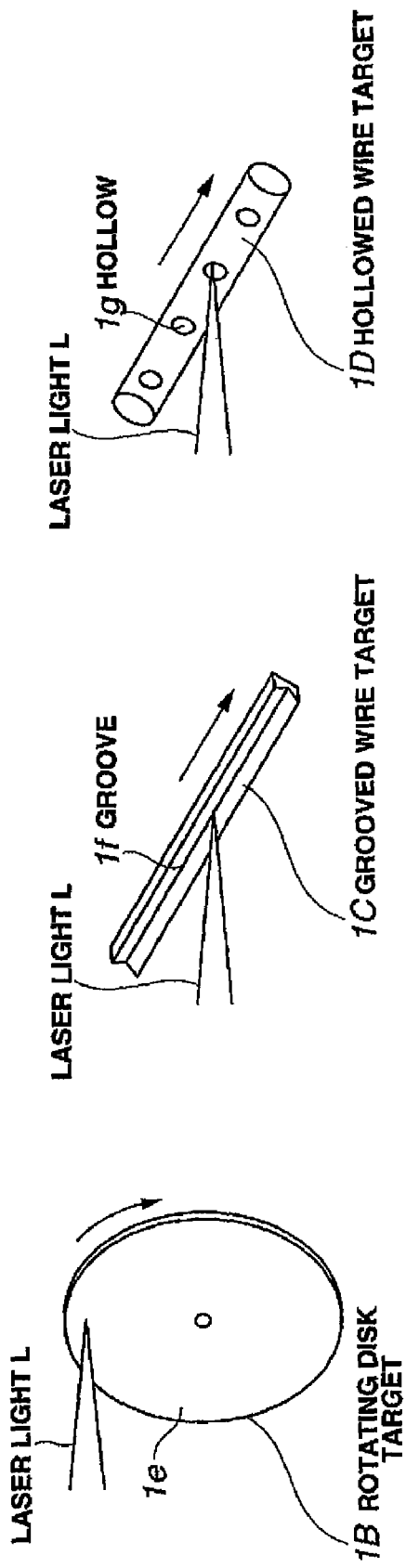

APPARATUS FOR AND METHOD OF WITHDRAWING IONS IN EUV LIGHT PRODUCTION APPARATUS

BACKGROUND OF THE INVENTION

1. Field of the Invention

The present invention relates to an EUV light production apparatus that is used as a light source for an exposure system and so on, and particularly, to an apparatus for and a method of withdrawing ions emitted from a target that has been made in a plasma state at an EUV light production point.

2. Description of Related Art

A light lithography technique, in which a circuit pattern is optically transferred on a semiconductor wafer, is important for realizing the integration in an LSI. As an exposure system used for light lithography, one that employs a reduced projection exposure method, i.e. a stepper, is utilized at present. Specifically, a light transmitted through an original image (reticule) pattern irradiated with a light source is projected on a light-sensitive material on a semiconductor substrate via a reduced projection optical system to form a circuit pattern. The resolution of the projected image is limited in accordance with the wavelength of the light source. For this reason, with a demand for making the width of lines of a pattern finer, the wavelength of the light source is getting shorter toward an ultraviolet region.

Recently, KrF excimer laser (wavelength: 248 nm) and ArF excimer laser (wavelength: 193 nm), which oscillate to produce deep ultraviolet light (DUV light), are used as a light source, and F2 laser, which oscillates to produce vacuum ultraviolet light (VUV light), is developed.

At present, in order to realize a finer process, attempts are made to use an extreme ultraviolet (EUV) light source (wavelength: 13.5 nm), which outputs EUV light, as a light source for light lithography.

There is a laser production plasma (LPP) method as one of methods for producing the EUV light.

With an EUV light source employing the LPP method, a target is irradiated with short-pulse laser light so that the target is excited into a plasma state in which the EUV light is produced, and then the produced EUV light is collected by a collector mirror to be output.

FIG. 1 is a view conceptually showing a configuration of an EUV light production apparatus employing the LPP method and used as a light source for an exposure system.

A collector mirror 3 for collecting EUV light is provided inside a vacuum chamber 2. The EUV light collected by the collector mirror 3 is transmitted to an exposure system (not shown) provided outside the vacuum chamber 2. The exposure system is a system for forming semiconductor circuit patterns on a semiconductor wafer with the EUV light.

A vacuum is drawn on the inside of the vacuum chamber 2 by means of a vacuum pump or the like to evacuate the inside because the EUV light having a short wavelength of 13.5 nm is not effectively transmitted if not under vacuum.

A target 1 serving as a EUV light production source is located on a predetermined EUV light production point A in the vacuum chamber 2, namely, a condensing point of laser light. Tin Sn, lithium Li, xenon Xe, or the like is used as a material for the target 1.

A driver laser unit 4 serving as a laser oscillator performs pulse-oscillation to produce and emit laser light L. Nd:YAG laser, $CO_2$ laser, or the like is used as a laser.

The laser light L via a laser condenser system is condensed on the EUV light production point A. The target 1 is irradiated with the laser light L at the timing when the target 1 reaches the EUV light production point A. The irradiation of the laser light L onto the target 1 makes the target 1 excited into a plasma state so that the target 1 emits EUV light.

The emitted EUV light diverges in all the directions centered on the plasma. The collector mirror 3 is disposed so as to surround the plasma. The EUV light that diverges in all the directions is collected by and reflected on the collector mirror 3. The collector mirror 3 selectively reflects the EUV light having a desired wavelength of 13.5 nm. The EUV light (output EUV light) reflected on the collector mirror 3 is transmitted to an exposure system.

The plasma emits neutral particles and ions having various velocities.

Meanwhile, with the demand for higher EUV light output, it is required to employ a high output laser unit as the driver laser unit 4 while high and stable output of the EUV light is maintained for a long period of time.

The neutral particles and ions emitted from the plasma are, however, deleterious in terms of the durability of the EUV light production system and the efficiency of the light output.

Specifically, since the collector mirror 3 is disposed in the vicinity of the plasma, the neutral particles and low-speed ions emitted from the plasma adhere to a reflection plane of the collector mirror 3, causing a deterioration in the index of reflection of the collector mirror 3.

On the other hand, high-speed ions emitted from the plasma damage multilayered film formed on the reflection plane of the collector mirror 3. This is called "spattering."

The production of the neutral particles can be suppressed by using a target having a minimum mass as disclosed in International Publication No. WO2002/46839 pamphlet, page 1, or by producing a completely ionized plasma by means of double pulse irradiation or the like.

The production of ions, however, is inevitable so long as the plasma is produced so that measures against the ions are indispensable.

As described above, low-speed ions adhere to the collector mirror 3, and deteriorate the index of reflection of the collector mirror 3. The ions that have adhered to the collector mirror 3, however, can be removed in principle by cleaning with reacted gas or the like as disclosed in US2006/0091109A1. After the cleaning, the index of reflection of the collector mirror 3 recovers, and hence the collector mirror 3 may be continuously used.

However, for the EUV light production apparatus used for exposure, recently there has been a demand to prolong, up to at least one year, the period when the 10% deterioration occurs in the index of reflection of the collector mirror 3. To meet the demand, the allowed value of the adhesion amount (thickness) of a metallic film on the reflection plane of the collector mirror 3 is very small value, e.g. about 0.75 nm if the target 1 is made of tin Sn. The high rate and high speed of cleaning are therefore required.

On the other hand, the high-speed ions spatter the surface of the collector mirror 3 as described above to damage the reflection film of the collector mirror 3, resulting in a deterioration in the index of reflection of the collector mirror 3. Replacement of the collector mirror 3 is required when the collector mirror 3 is damaged and the index of reflection thereof deteriorates. There is a technique of reproducing the reflection film of the collector mirror 3 of the EUV light production apparatus. In such a technique, however, a coating unit for precisely carrying out a coating process with good evenness of surface, e.g. about 0.2 nm (rms) is additionally provided, which leads to the increase in the cost of the apparatus. Also, since the damage in the reflection film of the collector mirror 3 varies from place to place, it is substantially impossible to reproduce the reflection film having even dispersion of the index of reflection. For this reason, it is general to laminate reflection films having hundreds of layers on the collector mirror 3 in order to increase the lifetime until the replacement of the collector mirror 3.

Further, as a method for reducing the damage density due to the high-speed ions, the distance between the collector mirror 3 and the EUV light generation point A may be set longer. According to this method, however, the collection solid angle of the collector mirror 3 for collecting the EUV light becomes small, which may cause a problem that effective EUV output for exposure becomes low.

In order to solve the above problem, the collector mirror 3 having a large diameter, e.g. 500 mm or more may be used. However, if the collector mirror 3 having such a large diameter is manufactured, it is difficult to produce the reflection films having hundreds of layers white keeping the accurate surface roughness and geometry. Further, even if the collector mirror 3 as described above could be manufactured, the manufacturing process would become complicated and the time required for it would become long, resulting in the collector mirror 3 being very expensive.

Meanwhile, the radiation intensity distribution of the EUV light is dependent upon a laser light incidence direction. Specifically, the relatively strong EUV light is emitted in the direction opposite to the laser light incidence direction. There is therefore proposed a system configuration in which the collector mirror 3 is provided with a hole for the laser light to pass therethrough, and the laser light is emitted toward the target 1 via the hole, whereby the strong EUV light is effectively collected by the collector mirror 3 disposed at a place where the collector mirror 3 faces a direction opposite to the laser light incidence direction. It should be noted that the term "laser light incidence direction" herein is used to mean the direction of the laser light when the laser light is emitted onto the EUV light production point A.

Furthermore, it was recently found out that not only the above mentioned radiation intensity distribution of the EUV light but also the quantity and intensity (kinetic energy) distribution of the ions emitted from the plasma are dependent upon the laser light incidence direction. That is, as shown in FIG. 2, the quantity and intensity (kinetic energy) of ions emitted are large and strong (high) in the direction opposite to the laser light incidence direction. Accordingly, if the collector mirror 3 is disposed at a place where the collector mirror 3 faces the direction opposite to the laser light incidence direction as shown by an alternate long and short dash line in FIG. 2, a problem may occur that the collector mirror 3 is vigorously damaged and the lifetime thereof becomes extremely short.

In order to solve the above problem, as shown in FIG. 3, Japanese Patent Application Laid-open No. 2005-197456 discloses that, by applying a magnetic field to the ions emitted from the plasma by means of magnets such that magnetic lines of force are in the direction perpendicular to the laser light incidence direction, the ions emitted from the plasma are deflected to the above perpendicular direction not to reach the collector mirror 3, thereby preventing the ion adhesion and the spattering on the collector mirror 3.

As to the invention disclosed in the Japanese Patent Application Laid-open No. 2005-197456, however; several Ts of strong magnetic field are required to deflect the high-speed ions reaching 10 keV in order to prevent them from reaching the collector mirror 3, and accordingly the cost of the electromagnet for applying the magnetic field becomes high. As a result the total cost of the EUV light production apparatus becomes high.

SUMMARY OF THE INVENTION

The present invention has been made in view of the above problems, and an object of the present invention is to remarkably suppress unrecoverable damages of the collector mirror 3 caused by the high-speed ions, and the adhesion, which is allowed only a little, of low-speed ions to the collector mirror 3 while reducing the cost required for the EUV light production apparatus, and also to effectively carry out the collection of the EUV light by the collector mirror 3.

In order to accomplish the object, a first aspect of the present invention provides an ion withdrawal apparatus that withdraws ions emitted from a plasma in an EUV light production apparatus in which a target at an EUV light production point is irradiated with laser light to make a plasma state and the target emits EUV light, the ion withdrawal apparatus which includes: a collector mirror that is disposed in a direction opposite to a laser light incidence direction to collect the EUV light and has a first hole for the ions to pass therethrough; first magnetic line of force production means that produces a magnetic line of force that is parallel or approximately parallel to the laser light incidence direction at or in the vicinity of the EUV light production point; and ion withdrawal means that is disposed on the opposite side of the collector mirror from the EUV light production point and withdraws the ions.

According to a second aspect of the present invention, the collector mirror has a hole for the laser light to pass therethrough and reach the EUV light production point.

According to a third aspect of the present invention, the ion withdrawal apparatus according to the first or second aspect of the present invention further includes magnetic line of force production means that further converges the magnetic line of force at an entrance of the ion withdrawal means to make the flux density higher.

According to a fourth aspect of the present invention, the ion withdrawal apparatus according to the first or second aspect of the present invention further includes voltage application means that applies a voltage on the ions to correct orbits of the ions at an entrance of the ion withdrawal means to introduce the ions into the entrance.

According to a fifth aspect of the present invention, the ion withdrawal apparatus according to the first or second aspect of the present invention further includes magnetic line of force production means that produces the magnetic line of force so as to deflect the ions toward an entrance of the ion withdrawal means.

According to a sixth aspect of the present invention) the ion withdrawal apparatus according to the first or second aspect of the present invention further includes voltage application means that applies a voltage on the ions so as to deflect the ions toward an entrance of the ion withdrawal means.

According to a seventh aspect of the present invention, the magnetic line of force is deflected toward an entrance of the ion withdrawal means by disposing the magnetic line of force so as to be inclined with respect to the collector mirror in the ion withdrawal apparatus according to the first or second aspect of the present invention.

According to an eighth aspect of the present invention, the ion withdrawal apparatus according to the sixth aspect of the present invention further includes a laser condenser system that condenses the laser light, a voltage being applied on the system.

According to a ninth aspect of the present invention, the laser condenser system and the magnetic line of force production means are disposed such that an incident axis of the laser light and a central axis of a magnetic field coincide or approximately coincide in the ion withdrawal apparatus according to the eighth aspect of the present invention.

According to a tenth aspect of the present invention, the target is a rotating disk target, a grooved wire target, or a hollowed wire target in the ion withdrawal apparatus according to the first or second aspect of the present invention.

An eleventh aspect of the present invention provides a method of withdrawing ions emitted from a plasma in an EUV light production apparatus in which a target at an EUV light production point is irradiated with laser light to be made in a plasma state and the target emits EUV light, the method which includes: producing a magnetic line of force that is parallel or approximately parallel to the laser light incidence direction at or in the vicinity of the EUV light production point; allowing the magnetic line of force to trap the ions; moving the trapped ions along the magnetic line of force; and introducing the trapped ions via a hole provided to a collector mirror into an entrance of ion withdrawal means to withdraw the trapped ions.

In the first aspect of the present invention, as shown in FIG. 4, a collector mirror 3 is disposed in a direction opposite to a laser light incidence direction, and collects EUV light. The collector mirror 3 has a hole 3e for the ions to pass therethrough.

Magnetic line of force production means 40 produces a magnetic line of force that is parallel or approximately parallel to the laser light incidence direction at or in the vicinity of the EUV light production point A (FIG. 5).

Ion withdrawal means 30 is disposed on the opposite side of the collector mirror 3 from the EUV light production point A. The ion withdrawal means 3 withdraws the ions.

In the first aspect, as shown in FIG. 5, a magnetic line of force that is parallel or approximately parallel to the laser light incidence direction at or in the vicinity of the EUV light production point A is produced. Accordingly, the magnetic line of force is allowed to trap the ions. The trapped ions move along the magnetic line of force. The trapped ions are then introduced into an entrance 30A of ion withdrawal means 30 via a hole 3e provided to the collector mirror 3. As a result, the trapped ions are withdrawn.

With the first aspect of the present invention, the magnetic line of force production means (magnet 40) can be made small and the cost required for the EUV light production apparatus can be reduced. Further, unrecoverable damages of the collector mirror 3 caused by the high-speed ions, and the adhesion, which is allowed only a little, of low-speed ions to the collector mirror 3 are remarkably suppressed. Furthermore, the collection of the EUV light by the collector mirror 3 can be effectively carried out.

In the second aspect of the present invention, the collector mirror 3 has a laser passage hole 3d for the laser light L to pass therethrough as shown in FIGS. 4B and 4C. The laser light L passes through the laser passage hole 3d of the collector mirror 3 to reach the EUV light production point A.

In the third aspect of the present invention, as shown in FIG. 7, there is additionally provided magnetic line of force production means (supplementary magnet 45 or supplementary core 46) for further converging the magnetic line of force at the entrance 30A of the ion withdrawal means 30 to make the flux density higher.

In the fourth aspect of the present invention, as shown in FIG. 9, there is additionally provided voltage application means 50 (direct current or pulse power supply 51, electrode 52) for applying a voltage on the ions to correct orbits of the ions at the entrance 30A of the ion withdrawal means 30 to be introduced thereinto.

In the fifth aspect of the present invention, as shown in FIG. 10, there is additionally provided magnetic line of force production means (magnets 47, 49 for deflection, or core 48 for deflection) for producing the magnetic line of force to deflect the ions toward the entrance 30A of the ion withdrawal means 30.

In the sixth aspect of the present invention, as shown in FIG. 11, there is additionally provided voltage application means 55 (direct current or pulse power supply 56, electrode 57) for applying a voltage on the ions to deflect the ions toward the entrance 30A of the ion withdrawal means 30.

In the seventh aspect of the present invention, as shown in FIG. 13, the magnetic line of force is deflected toward the entrance 30A of the ion withdrawal means 30 by disposing the magnetic line of force production means (magnet 40) so as to be inclined with respect to the collector mirror 3.

In the eighth aspect of the present invention, as shown in FIG. 14, a voltage is applied on a laser condenser system 8 (collector mirror 8A) for condensing the laser light. Accordingly, the laser condenser system 8 (collector mirror 8A) functions as the electrode for deflection as is the case with the sixth aspect of the present invention. As a result, the ions are deflected toward the entrance 30A of the ion withdrawal means 30.

In the ninth aspect of the present invention, as shown in FIGS. 10, 11, 12, 13, and 14, the laser condenser system 8 and the magnetic line of force production means (magnet 40) are disposed such that an incident axis of the laser light and a central axis of a magnetic field coincide or approximately coincide.

In the tenth aspect of the present invention, as shown in FIG. 15, the target 1 is formed by a rotating disk target 1B, a grooved wire target 1C, or a hollowed wire target 1D.

The eleventh aspect of the present invention provides a method corresponding to the apparatus according to the first aspect of the present invention. Specifically, as shown in FIG. 5, the method includes 1) producing a magnetic line of force that is parallel or approximately parallel to the laser light incidence direction at or in the vicinity of the EUV light production point A; 2) allowing the magnetic line of force to trap the ions; 3) moving the trapped ions along the magnetic line of force; and 4) introducing the trapped ions via a hole 3e provided to the collector mirror 3 into an entrance 30A of ion withdrawal means 30 to withdraw the trapped ions.

BRIEF DESCRIPTION OF THE DRAWINGS

In the accompanying drawings:

FIG. 4A shows the overall configuration of the apparatus, and FIGS. 4B and 4C show a reflection plane of a collector mirror;

FIG. 6A is a view for explaining the first embodiment and FIG. 6B is a view for explaining the conventional art shown in FIG. 3;

FIGS. 15A through 15C are views showing configurations of an apparatus according to a tenth embodiment, and particularly showing examples of a target other than a droplet target.

DETAILED DESCRIPTION OF THE INVENTION

Embodiments of an apparatus for and a method of withdrawing ions in an EUV light production apparatus will be described with reference to the accompanying drawings.
(First Embodiment)

Figure 4:
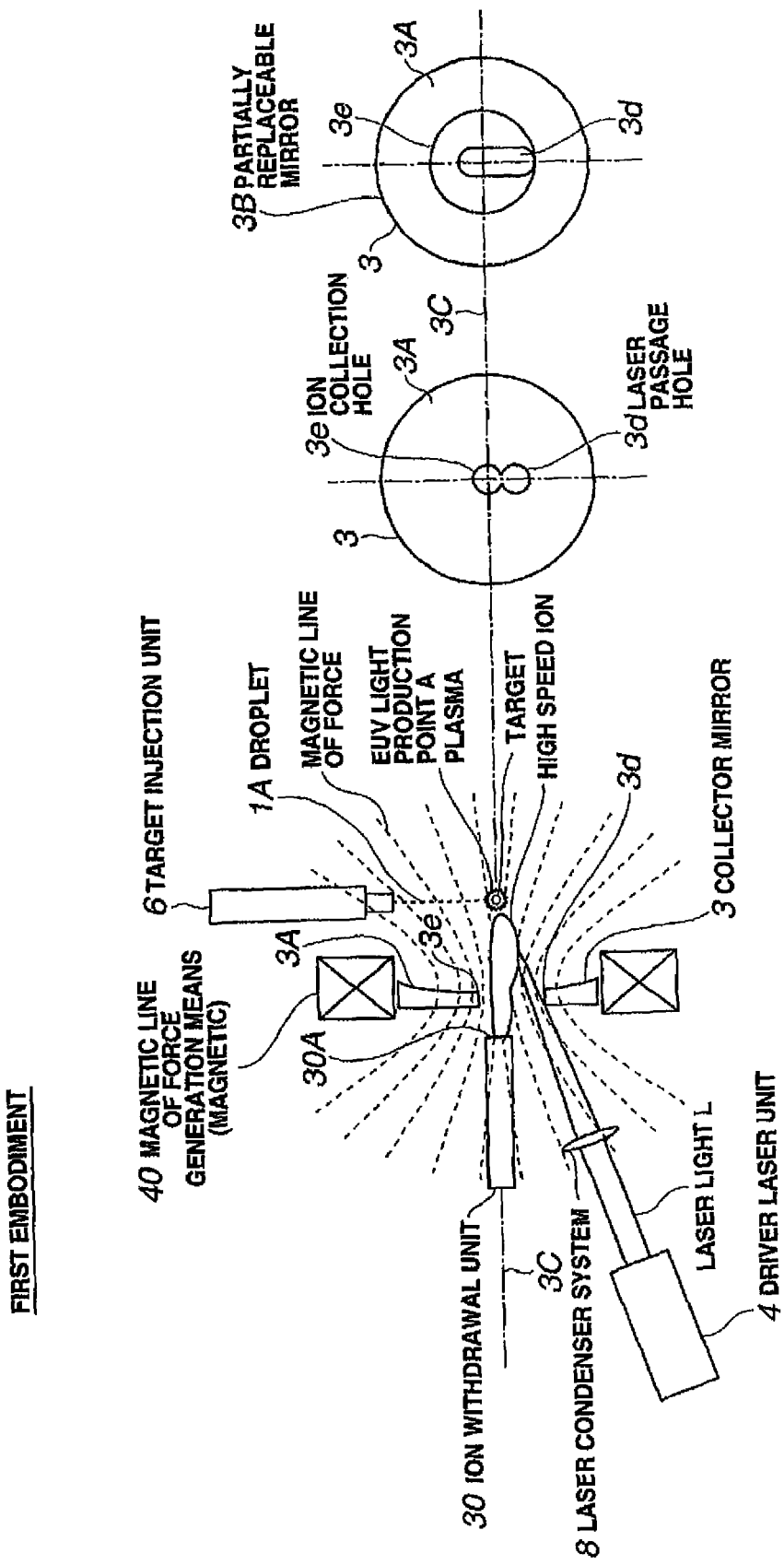
FIGS. 4A through 4C are views showing a configuration of an apparatus according to a first embodiment.

FIGS. 4A through 4C are views showing a configuration of an apparatus according to a first embodiment. FIG. 4A shows the overall configuration of the apparatus, and FIGS. 4B and 4C show a reflection plane 3A of a collector mirror 3.

Figure 1:
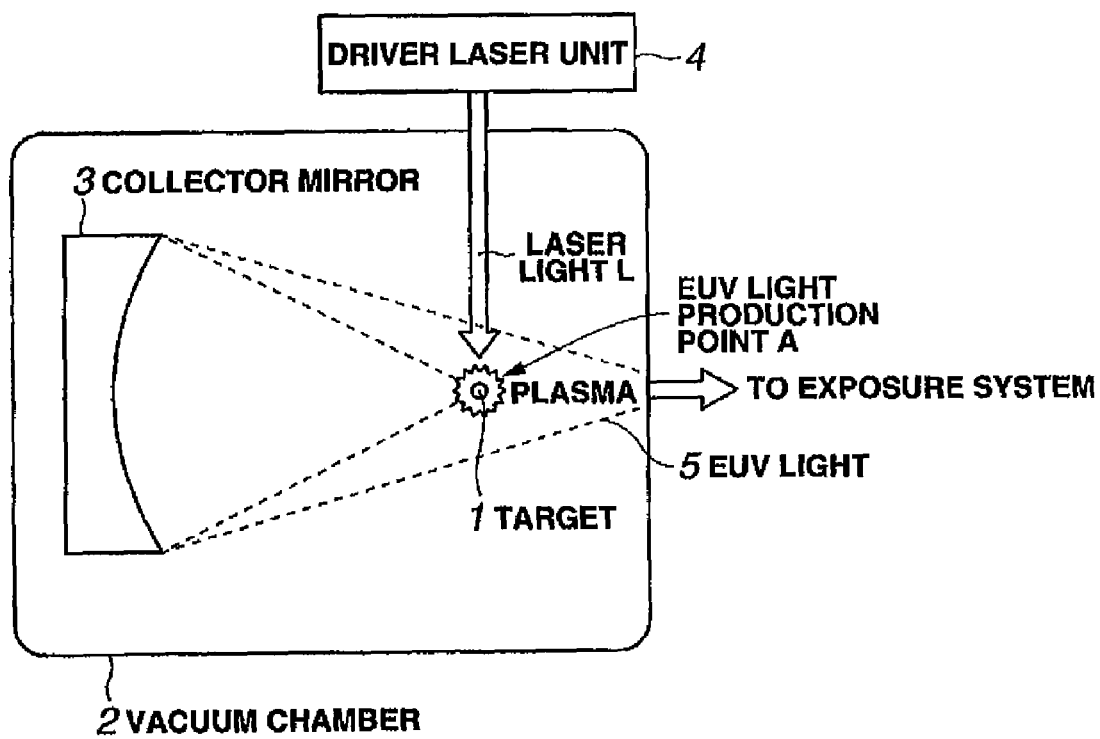
FIG. 1 is a view for explaining a conventional art, conceptually showing the configuration of an EUV light production apparatus that employs an LPP method.

The EUV light production apparatus shown in FIG. 4A has a target 1 located on EUV light production point A in a plasma state to allow it to produce EUV light and output it outside, like the apparatus shown in FIG. 1.

The EUV light production apparatus employs an LLP method and is used as a light source for an exposure system (not shown).

Specifically, a collector mirror 3 for collecting EUV light is provided inside a vacuum chamber 2 (not shown) of the EUV light production apparatus. The EUV light collected by the collector mirror 3 is transmitted to the exposure system provided outside the vacuum chamber 2, like the apparatus shown in FIG. 1. The exposure system is a system for forming semiconductor circuit patterns on a semiconductor wafer with the EUV light.

A vacuum is drawn on the inside of the vacuum chamber 2 by means of a vacuum pump or the like to evacuate the inside, and gas in the vacuum chamber is exhausted to outside by an exhaust unit. The reason why a space for producing the EUV light is evacuated is that the EUV light having a short wavelength of 13.5 nm is not effectively transmitted if not under vacuum.

A target 1 serving as a EUV light production source is supplied to a predetermined EUV light production point A, namely a condensing point of laser light L, in the vacuum chamber as a droplet 1A. A target injection unit 6 injects the droplet 1A toward the EUV light production point A, in other words, drops the droplet 1A immediately below.

The droplet 1A is a liquid metal, metallic solution, metallic compound solution, or colloid solution containing metallic particles or metallic compound particles.

In a case where the target 1 in the droplet 1A is formed by a metal, a main constituent of the metal is tin Sn, lithium Li, or the like.

In a case where the target 1 in the droplet 1A is formed by a metallic compound, a main constituent of the metallic compound is tin oxide $SnO_2$, or the like.

A main constituent of the solvent of the droplet 1A may be a liquid having dispersibility, an organic solvent, water, a liquid nitrogen, or a liquid xenon. The organic solvent may be methanol, ethanol, acetone, or mixture solution of them.

A description will be given hereinafter supposing that the droplet 1A is colloid solution containing metallic particles of tin Sn or metallic compound particles of tin oxide $SnO_2$.

A driver laser unit 4 serving as a laser oscillator performs pulse oscillation to produce and emit the laser light L. The laser used is a $CO_2$ laser. Note that other lasers such as Nd:YAG laser may be employed.

The laser light L is condensed on the EUV light production point A via a laser condenser system 8 comprising condenser lens and so on. The target 1 is irradiated with the laser light L at the timing when the target 1 in the droplet 1A reaches the EUV light production point A. The irradiation of the laser light L on the target 1 makes the target excited into a plasma state to emit the EUV light. That is, the target 1, which is a fixed space where the metallic particles, the metallic compound particles, or an aggregate of metallic particles or metallic compound particles disperses, is excited into the plasma state.

The emitted EUV light 5 diverges in all the directions centered on the plasma. It should be noted that, as described above, the radiation intensity distribution of the EUV light is dependent upon the laser light incidence direction and thus the relatively strong EUV light is emitted in the direction opposite to the laser light incidence direction.

The collector mirror 3 is disposed so as to surround the plasma. The collector mirror 3 is disposed in a direction opposite to the laser light incidence direction. Thus, the collector mirror 3 effectively collects relatively strong EUV light emitted in the direction opposite to the laser light incidence direction among the EUV light emitted in all the direction, and then reflects the collected EUV light. The collector mirror 3 selectively reflects the EUV light having a desired wavelength of 13.5 nm. A coating, such as an Mo/Si film, having a high index of reflection around the wavelength of 13.5 nm, is applied to the collector mirror 3. The EUV light (output EUV light) reflected on the collector mirror 3 is transmitted to an exposure system (not shown).

The plasma emits ions. As described above with reference to FIG. 2, the quantity and intensity (kinetic energy) distribution of the ions emitted from the plasma are dependent upon the laser light incidence direction. Particularly, the radiation amount and intensity (kinetic energy) of the ions emitted in the direction opposite to the laser light incidence direction is large and strong (high).

An ion withdrawal unit 30 is disposed on the opposite side of the collector mirror 3 from the EUV light production point A. The ion withdrawal unit 30 introduces the ions through an entrance 30A thereof. The ion withdrawal unit 30 comprises a filter; a vacuum pump, etc., and withdraws the ions by trapping them, or drawing the vacuum to exhaust them outside.

Characteristic elements of the apparatus according to the first embodiment will be described hereinbelow.

The collector mirror 3 is disposed in the direction opposite to the laser light incidence direction. The collector mirror 3 is also disposed such that reflection plane 3A thereof faces the EUV light production point A while a central axis $3c$ thereof is perpendicular to the injection direction (direction immediately below in FIG. 4A) of the droplet 1A from the target injection unit 6. Hereinunder, arrangement of the elements of the apparatus will be described suitably on the basis of "the central axis 3c of the collector mirror 3."

The collector mirror 3 has a laser passage hole 3d through which the laser light L passes as shown in FIGS. 4B and 4C. The driver laser unit 4 and laser condenser system 8 are arranged such that the laser light L passes through the laser passage hole 3d. The laser light L advances upwardly in the figures at a predetermined angel with respect to the central axis 3c of the corrector mirror 3 and then reaches the EUV light production point A.

The collector mirror 3 also has an ion collection hole 3e through which the ions passed as shown in FIGS. 4B and 4C. The ion collection hole 3e is formed in a higher position than the laser passage hole 3d. The ion collection hole 3e is formed such that the center thereof coincides with the central axis 3c of the collector mirror 3.

The ion collection hole 3e may be formed apart from the laser passage hole 3d as shown in FIG. 4B. Alternatively, the ion collection hole 3e may be formed such that the ion collection hole 3e and the laser passage hole 3d are linked together to form a rectangular-shaped hole as a whole.

In this embodiment, a description is given on the assumption that the collector mirror 3 has the laser passage hole 3d and the laser L passes through the collector mirror 3 to reach the EUV light production point A. However, as will be described later, depending on the arrangement of the driver laser unit 4 and laser condenser system 8, it is not necessary for the laser light L to pass through the collector mirror 3 so long as the laser light incidence direction is parallel or approximately parallel to the magnetic lines of force at or in the vicinity of the EUV light production point A.

The ion withdrawal unit 30 is disposed in the direction perpendicular to the injection direction of the droplet 1A from the target injection unit 6, in other words, disposed in the direction of the central axis 3c of the collector mirror 3.

A magnet 40 as magnetic line of force production means is arranged around the periphery of the collector mirror 3.

The magnet 40 produces magnetic lines of force parallel or approximately parallel to the magnetic lines of force at or in the vicinity of the EUV light production point A.

Figure 5:
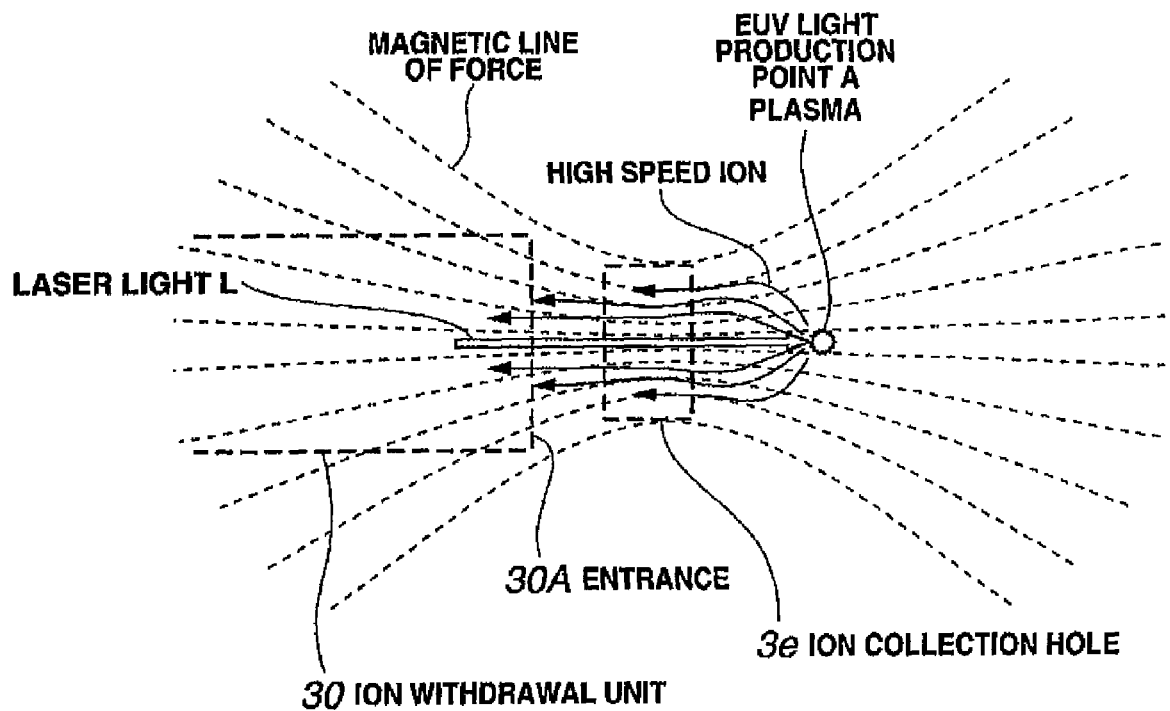
FIG. 5 is a view for explaining the relation between magnetic lines of force formed by magnets and behavior of ions emitted from the plasma.

FIG. 5 is a view for explaining the relation between the magnetic lines of force formed by the magnet 40 and the behavior of the ions emitted from the plasma.

Hereinbelow, the operation and effect of the elements of the apparatus according to the first embodiment will be described.

With the apparatus of the first embodiment, the target injection unit 6 injects the droplet 1A toward the EUV light production point A, in other words, drops it.

On the other hands, the driver laser unit 4 emits the laser light L. The emitted laser light L advances via the laser condenser system 8 toward the collector mirror 3, passes through the laser passage hole 3d, and then reaches the EUV light production point A. The target 1 is irradiated with the laser light L at the timing when the target 1 reaches the EUV light production point A. The irradiation of the laser light L on the target 1 makes the target excited into a plasma state so that the target 1 emits the EUV light.

Relatively strong EUV light is emitted in the direction opposite to the laser light incidence direction. Thus, the EUV light is effectively collected by the collector mirror 3 disposed in the direction opposite to the laser light incidence direction. The collector mirror 3 reflects the collected EUV light. The EUV light (output EUV light) reflected on the collector mirror 3 is transmitted to an exposure system (not shown).

The plasma emits ions. As described above with reference to FIG. 2, the quantity and intensity (kinetic energy) distribution of the ions emitted from the plasma are also dependent upon the laser light incidence direction. Particularly, the radiation amount and intensity (kinetic energy) of the ions emitted in the direction opposite to the laser light incidence direction is large and strong (high).

The ions move in a magnetic field produced by the magnet 40. As well known, Lorentz force acts on an ion, which is a charged particle, in a magnetic field and thus the ion advances along a magnetic line of force while rotating around the magnetic line of force with a certain Larmor radius. That is, the ion is trapped in the magnetic line of force and then moves along the magnetic line of force.

The magnet 40 produces magnetic lines of force parallel or approximately parallel to the magnetic lines of force at or in the vicinity of the EUV light production point A. Accordingly, the direction of the magnetic lines of force approximately coincides with an initial movement direction of the ion. Specifically, as shown in FIG. 5, as for the initial movement direction, almost all the ions are emitted from the plasma in a state where the component parallel to the magnetic line of force accounts for a large part, while the component perpendicular to the magnetic line of force accounts for a small part. Larmor radius therefore becomes short and thus high-speed ions converge on a narrow range. Since the convergence range of the high-speed ions is narrow, the high-speed ions surely pass through the ion collection hole 3e of the collector mirror 3. As a result, the ion collection hole 3e may be made narrow. After passing through the ion collection hole 3e of the collector mirror 3, the high-speed ions further advance along the magnetic lines of force and then are introduced into the entrance 30A of the ion withdrawal unit 30 to be withdrawn. Since the convergence range of the high-speed ions is narrow, the structure of the ion withdrawal unit 30 may be simplified such that the entrance 30A thereof may be made narrow. For example, when an Sn droplet having several tens μm of diameter is irradiated with a $CO_2$ laser having intensity up to $10^9$ W/cm$^2$ and the high-speed ions are collected on the central magnetic field up to 2 T, the high-speed ions can be converged on a range of ten and several mm of diameter at a place 100 mm apart from the plasma production point A. Consequently, the diameters of the ion collection hole 3e of the collector mirror 3 and the entrance 30A of the ion withdrawal unit 30 may be set in accordance with this convergence range of ten and several mm of the high-speed ions.

Figure 2:
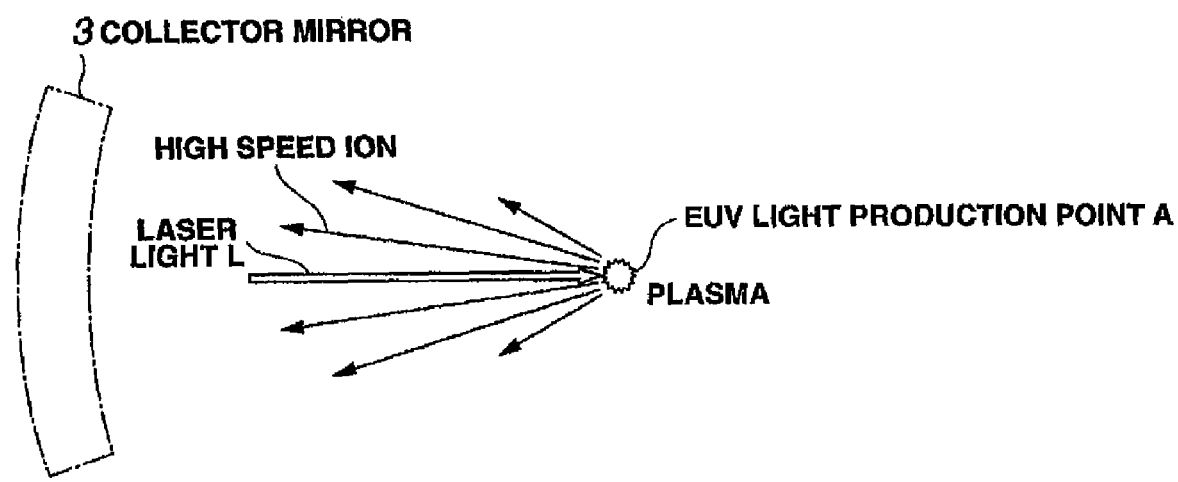
FIG. 2 is a view for explaining that the quantity and intensity (kinetic energy) of emission of ions become large and strong (high) in the direction opposite to a laser light incidence direction.

As described above, according to this embodiment, it is possible to effectively converge the high-speed ions that may cause the damage of the collector mirror 3 and to withdraw them without any collision against the collector mirror 3 while maintaining high efficiency of EUV light collection. This is apparent if compared with the case in which a magnetic field is not applied by the magnet 40. More specifically, if the magnetic field is not applied, the high-speed ions emitted from the target 1, in general, are produced mainly in the direction opposite to the laser light incidence direction, but diffuses in all the direction as time passes as shown in FIG. 2. Accordingly, the high-speed ions are emitted on the whole reflection plane 3A, which extremely shortens the lifetime of the collector mirror 3. In contrast, as shown in FIG. 5, according to this embodiment, since the magnet 40 produces a magnetic field at or in the vicinity of the EUV light production point A to define magnetic lines of force parallel or approximately parallel to the laser light incidence direction, the diffusing high-speed ions can be deflected to converge on a narrow range. For this reason, it is possible to converge the high-speed ions on a narrow range on the reflection plane 3A of the collector mirror 3, namely a range corresponding to the ion collection hole 3e, and allow the high-speed ions to pass through the collector mirror 3 without colliding with collector mirror 3 so as to be withdrawn.

According to this embodiment, almost all the high-speed ions emitted from the plasma can be withdrawn. However, the periphery of the ion collection hole 3e may be liable to suffer the collision of the ions due to minor ions at an edge of the kinetic energy distribution at the time of production of the ions and various instabilities though this probability is low. In this view, the periphery of the ion collection hole 3e of the collector mirror 3 may be formed by the partially replaceable mirror 3B, which is partially replaceable, as shown in FIG. 4C. Accordingly, only the partially replaceable mirror 3B can be replaced when the partially replaceable mirror 3B has almost run down before other parts of the collector mirror 3. Consequently, maintenance cost thereof can be further reduced as compared with a case in which the whole collector mirror 3 is replaced.

Furthermore, according to this embodiment, the magnet 40 may be introduced at low cost so that the whole cost of the EUV right production apparatus can be reduced. This is apparent if compared with the conventional art as described above with reference to FIG. 3.

Figure 3:
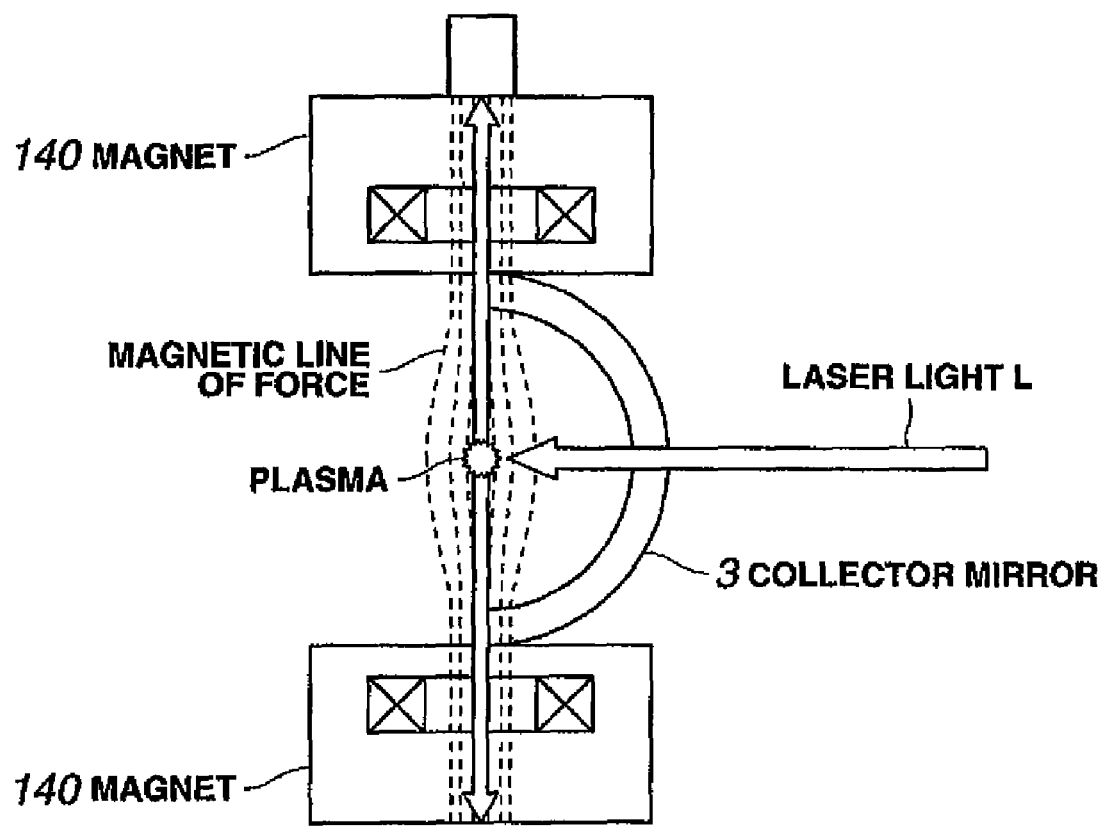
FIG. 3 a view for explaining another conventional art, specifically showing a configuration for applying a magnetic field to the ions emitted from a plasma such that magnetic lines of force are formed in the direction perpendicular to the laser light incidence direction.

FIG. 3 shows an apparatus in which the magnets 140, 140 are respectively disposed above and below the collector mirror 3 to form a mirror magnetic field so that the high-speed ions are discharged in upward and downward directions of the mirror magnetic field.

Unlike the apparatus according to this embodiment, the magnetic lines of force in the apparatus shown in FIG. 3 are produced perpendicular to the laser light incidence direction.

Figure 6B:
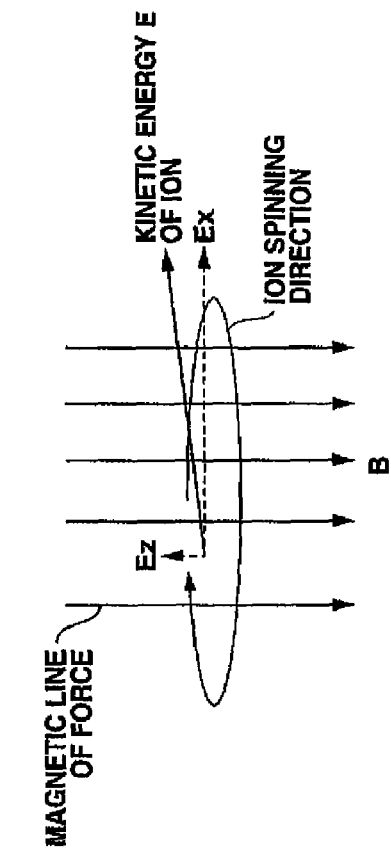
FIGS. 6A and 6B are views for explaining the relation between the magnetic lines of force and kinetic energy of an ion.
Figure 6A:
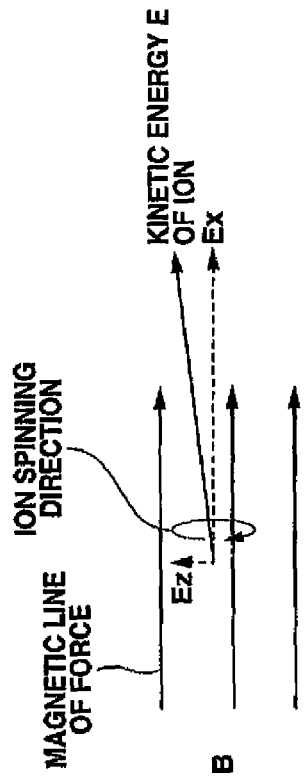

FIG. 6A and 6B are views for explaining the relation between the magnetic lines of force and the kinetic energy of an ion.

FIG. 6A is a view for explaining the first embodiment, in which the movement direction of the ions is approximately parallel to the magnetic lines of force, and FIG. 6B is a view for explaining the conventional art shown in FIG. 3, in which the movement direction of the ions is approximately perpendicular to the magnetic lines of force.

Supposing, for example, that conditions of the target 1 and laser emission of the apparatus according to the first embodiment are equivalent to those of the prior apparatus shown in FIG. 3, the kinetic energies E of the high-speed ions in FIG. 6A and FIG. 6B become equivalent to each other. Here, among the kinetic energy E of the high-speed ion, the component parallel to the laser light incidence direction is denoted as Ex and the component perpendicular to the laser light incidence direction is denoted as Ez.

The direction B in the magnetic lines of force is approximately parallel to the kinetic energy E of the ions in this embodiment (FIG. 6A) while the direction B in the magnetic lines of force is approximately perpendicular to the kinetic energy E of the ions in the conventional art (FIG. 6B). Therefore, in the apparatus of the first embodiment, among the kinetic vectors of the high-speed ions, a direction in which the high-speed ions are to be discharged and withdrawn is a vector Ex and originally long, and hence it is easy to discharge and withdraw the high-speed ions. Further, since the size of a vector Ez, to which the high-speed ions are to be deflected by applying Lorentz force, is originally short, Larmor radius thereof can be made short and thus a flux density necessary for the withdrawal becomes low. In contrast, as to the apparatus of the conventional art, a direction in which the high-speed ions are to be discharged and withdrawn is the vector Ez, and the size thereof is small. Thus, it is difficult to discharge and withdraw the high-speed ions. The direction in which the high-speed ions are to be deflected in order to avoid the collision against the collector mirror 3 is the vector Ex, and the size thereof is large. Thus, a higher flux density is required. As a result, the apparatus of the conventional art requires a stronger electromagnet and the cost of the apparatus increases. In contrast, according to the apparatus of the first embodiment, even with a small flux density, discharge and withdrawal effect can be sufficiently obtained as compared with the apparatus of the conventional art, and accordingly a relatively small electromagnet (magnet 40) can be employed, which provides a benefit of reducing the apparatus cost.

An embodiment obtained by modifying the apparatus according to the first embodiment may be also possible. Modified embodiments will be described hereafter. The description for the same component as that of the first embodiment will be omitted, and the description for changed parts and added parts will be given.

(Second Embodiment)

Figure 7A:
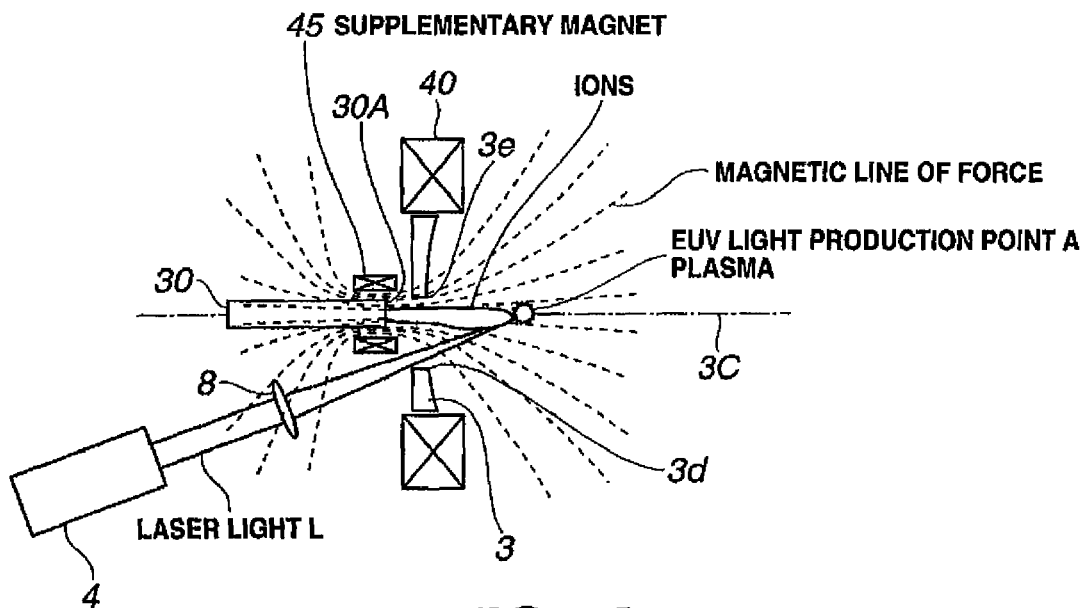
FIGS. 7A and 7B are views showing configurations of an apparatus according to a second embodiment.
Figure 7B:
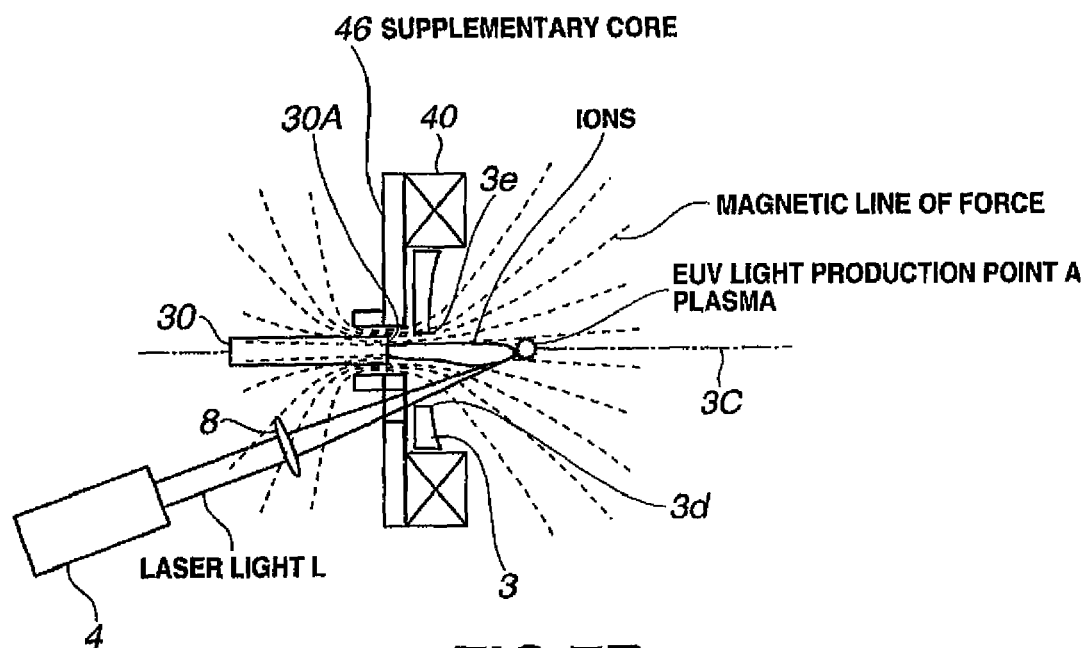

FIGS. 7A and 7B show configurations of an apparatus according to a second embodiment.

In the second embodiment, a supplementary magnet 45 or a supplementary core 46 as magnetic force production means for further converging the magnetic lines of force at the entrance 30A of the ion withdrawal unit 30 to make the flux density higher is additionally provided.

FIG. 7A shows an apparatus obtained by adding the supplementary magnet 45 to the apparatus of the first embodiment as described above.

The supplementary magnet 45 surrounds the entrance 30A of the ion withdrawal unit 30 and is disposed so as to apply a magnetic field to a small space in the vicinity of the entrance 30A. The supplementary magnet 45 further converges the magnetic lines of force at the entrance 30A of the ion withdrawal unit 30 to make the flux density higher. The size of the supplementary magnet 45 can be minimized even if the flux density thereof is equal to or larger than that of the magnet 40.

Since the magnetic lines of force are further converged by the supplementary magnet 45, the efficiency of withdrawal of the high-speed ions by the ion withdrawal unit 30 is enhanced and the ion withdrawal unit 30 can be made smaller. Furthermore, since the magnetic lines of force are further converged, the diameter of the ion collection hole 3e of the collector mirror 3 can be made short and the area for collecting the EUV light on the collector mirror 3 can be made wide.

It may be possible to employ the configuration shown in FIG. 7B to obtain the same operation and effect as the configuration shown in FIG. 7A.

FIG. 7B shows an apparatus obtained by adding the supplementary core 46 to the apparatus of the first embodiment.

The supplementary core 46 surrounds the entrance 30A of the ion withdrawal unit 30 and is disposed so as to apply a magnetic field to a small space in the vicinity of the entrance 30A. The supplementary core 46 further converges the magnetic lines of force at the entrance 30A of the ion withdrawal unit 30 to make the flux density higher. By using the supplementary core 46 in place of the supplementary magnet 45, the operation and effect same as the case in which the supplementary magnet 45 is used can be obtained with a configuration simpler than the case in which the supplementary magnet 45 is used.

(Third Embodiment)

Figure 8A:
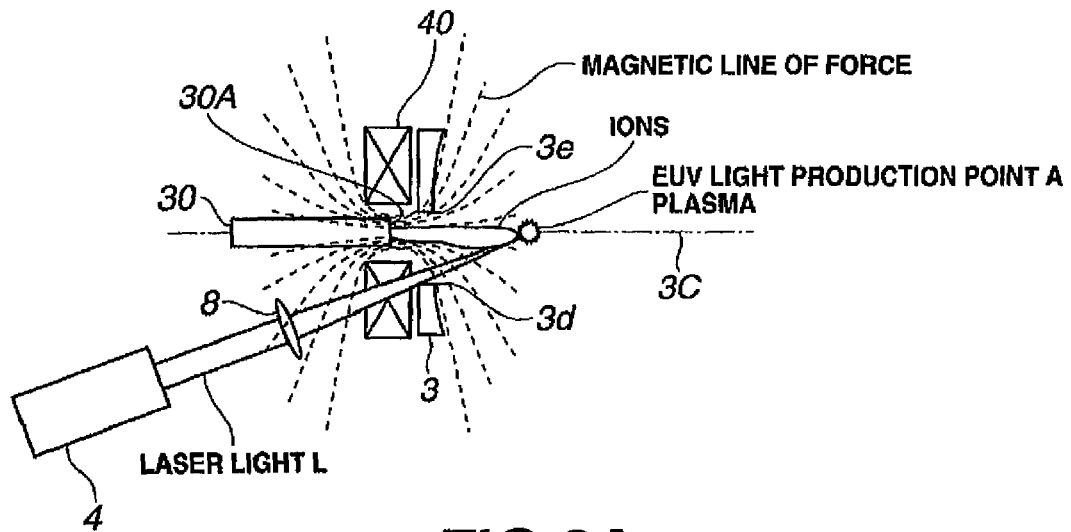
FIGS. 8A and 8B are views showing configurations of an apparatus according to a third embodiment.
Figure 8B:
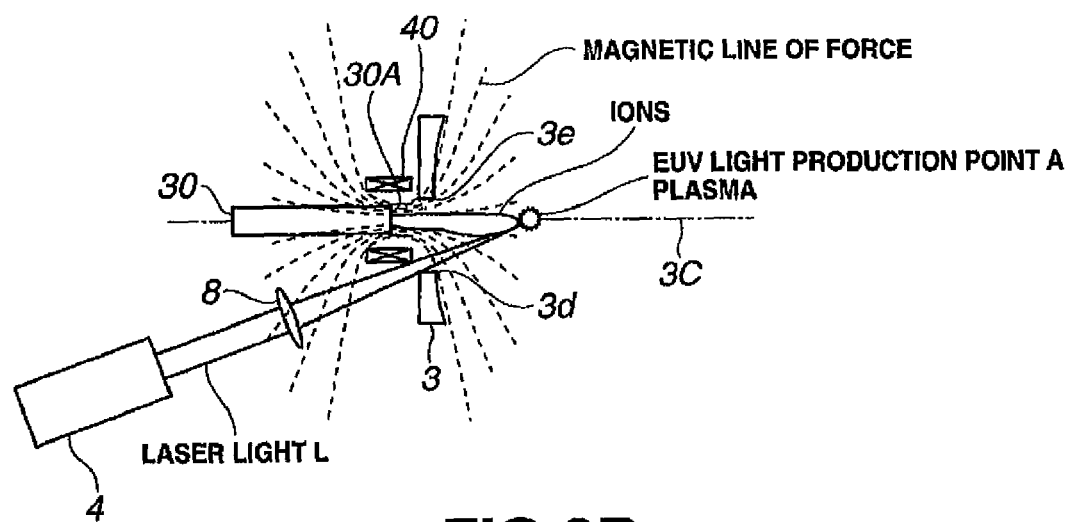

FIGS. 8A and 8B are views showing configurations of an apparatus according to a third embodiment.

FIGS. 8A and 8B each show an apparatus obtained by modifying the position of the magnet 40 in the first embodiment.

The magnet 40 is disposed around the periphery of the collector mirror 3 in the first embodiment while the magnet 40 in the third embodiment is disposed on the opposite side of the collector mirror 3 from the EUV light production point A. In other words, the magnet 40 is provided so as to surround the entrance 30A of the ion withdrawal unit 30.

The magnet 40 of the apparatus shown in FIG. 8A can be smaller than that of the apparatus of the first embodiment However, it is necessary for the magnet 40 to have a hole 40a that allows the laser light L to pass therethrough.

Since the magnet 40 is provided to surround the entrance 30A of the ion withdrawal unit 30, the magnet 40 can be miniaturized while the flux density same as that of the apparatus of the first embodiment is maintained. As mentioned above, though it is necessary for the magnet 40 to have the hole 40a, the cost of the magnet can be reduced despite that.

The apparatus shown in FIG. 8B employs the magnet 40 that is far smaller than that shown in FIG. 8A. For example, a small permanent magnet may be used.

Specifically, the directivity of intensity distribution of the high-speed ions may become very strong according to a laser irradiation method and the type of the target 1. In other words, the directivity becomes very strong when a solid target having a groove or hollow, such as a wire target with a groove, a wire target with hollows, is used in place of a droplet target as the target 1 as will be described later. The directivity of intensity distribution of the high-speed ions is originally strong even when a droplet target is employed. However; the directivity of intensity distribution of the high-speed ions becomes further strong when the grove or the hollow of a solid target is irradiated with the laser light L. Since the directivity of intensity distribution of the high-speed ions becomes stronger, the convergence action of the magnetic lines of force necessary for obtaining the same ion withdrawal efficiency can be made weaker, accordingly. As a result, a small permanent magnet may be employed. Since the small permanent magnet may be employed as the magnet 40, the entire apparatus shown in FIG. 8B can be further simplified and also miniaturized.

(Fourth Embodiment)

Figure 9:
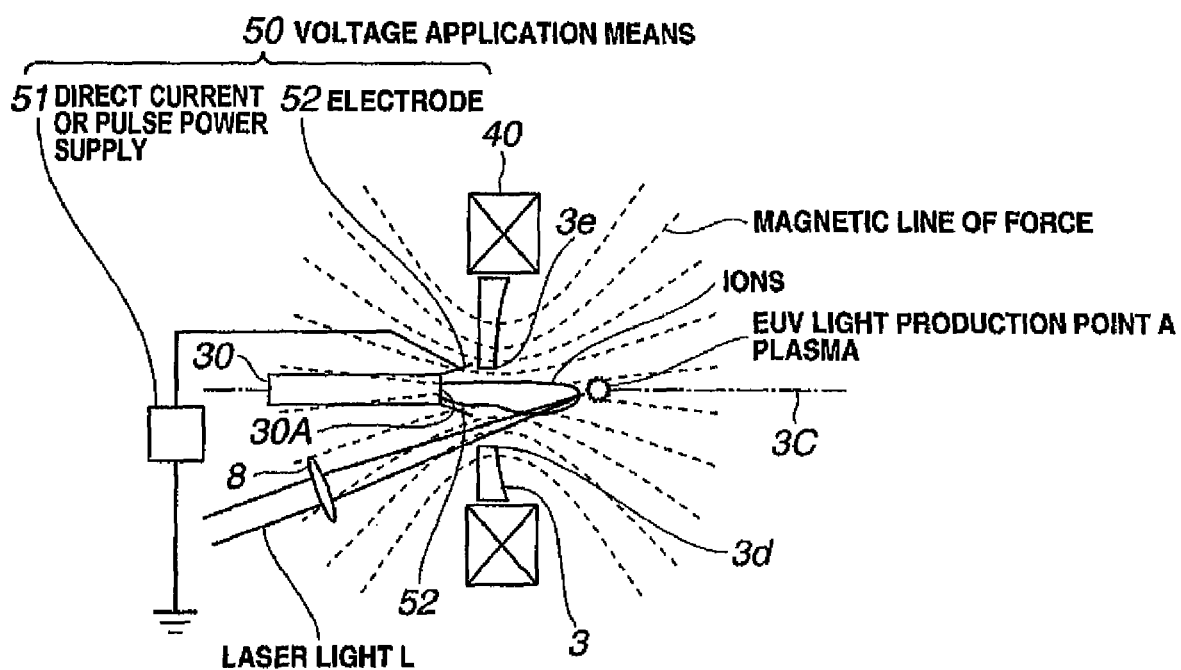
FIG. 9 is a view showing a configuration of an apparatus according to a fourth embodiment.

FIG. 9 shows a configuration of an apparatus according to the fourth embodiment.

In the fourth embodiment, voltage application means 50 for applying a voltage on the ions is additionally provided so as to correct orbits of the ions at the entrance 30A of the ion withdrawal unit 30 to introduce the ions to the entrance 30A.

The apparatus shown in FIG. 9 is obtained by adding the voltage application means 50 comprising a direct current or pulse power supply 51 and an electrode 52 to the apparatus of the above first embodiment.

The electrode 52 is provided in the vicinity of the entrance 30A of the ion withdrawal unit 30. The electrode 52 is electrically connected with the direct current or pulse power supply 51.

In the apparatus of the first embodiment, according to the shape of the magnetic lines of force, the magnetic lines of force may diverge in the vicinity of the entrance 30A.

In this view, a direct current voltage or pulsed voltage is applied on the electrode 52 by the direct current or pulse power supply 51. When the applied voltage is direct current, it is preferable to make the polarity of the electrode coincide with that of the ions. Accordingly, the orbits of the ions, which are charged particles, are corrected by a repulsion of the electric field, whereby the ions are introduced into the entrance 30A of the ion withdrawal unit 30.

When the applied voltage is a pulsed voltage, the polarity may be changed according to the timing of applying the voltage on the electrode 52. Specifically, a voltage having a polarity opposite to that of the ions is applied at the timing when the ions pass through a region where the magnetic lines of force tend to diverge, while a voltage having the same polarity as that of the ions is applied at the timing when the ions pass in the vicinity of the entrance 30A of the ion withdrawal unit 30. As a result, the orbits of the ions, which are charged particles, are corrected and thus the ions are introduced into the entrance 30A of the ion withdrawal unit 30.

As described above, according to this embodiment, the orbits of the high-speed ions converged by the magnetic field are corrected by the electric field, and accordingly the high-speed ions are introduced into the entrance 30A of the ion withdrawal unit 30. Consequently, the efficiency of withdrawal of the ions by the ion withdrawal unit 30 is enhanced.

(Fifth Embodiment)

Figure 10A:
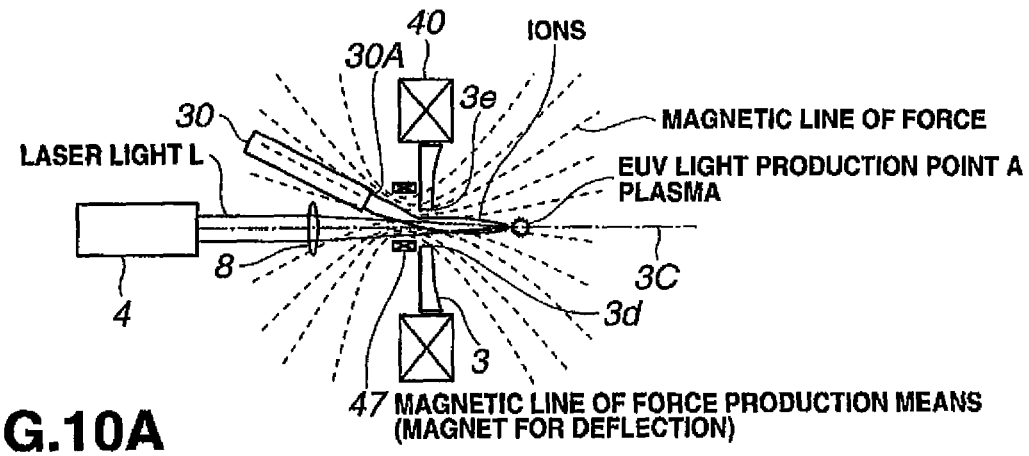
FIGS. 10A through 10C are views showing configurations of an apparatus according to a fifth embodiment.
Figure 10B:
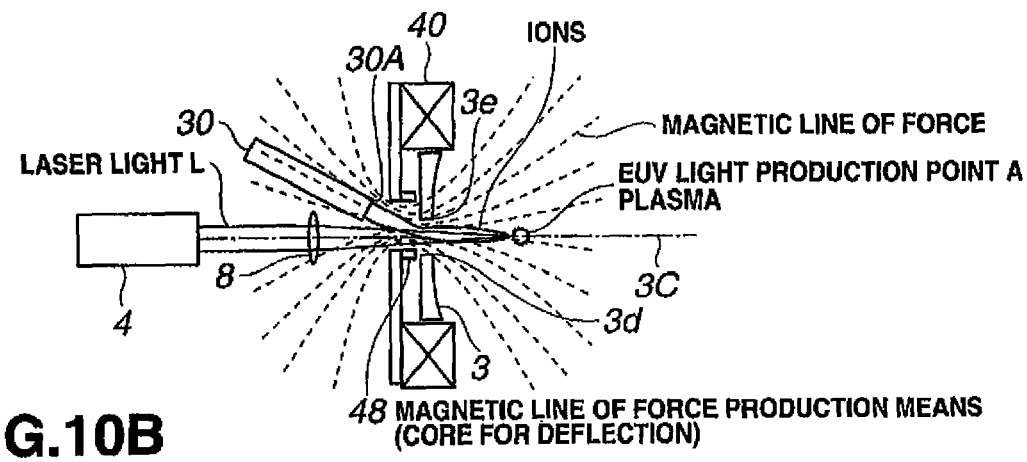
Figure 10C:
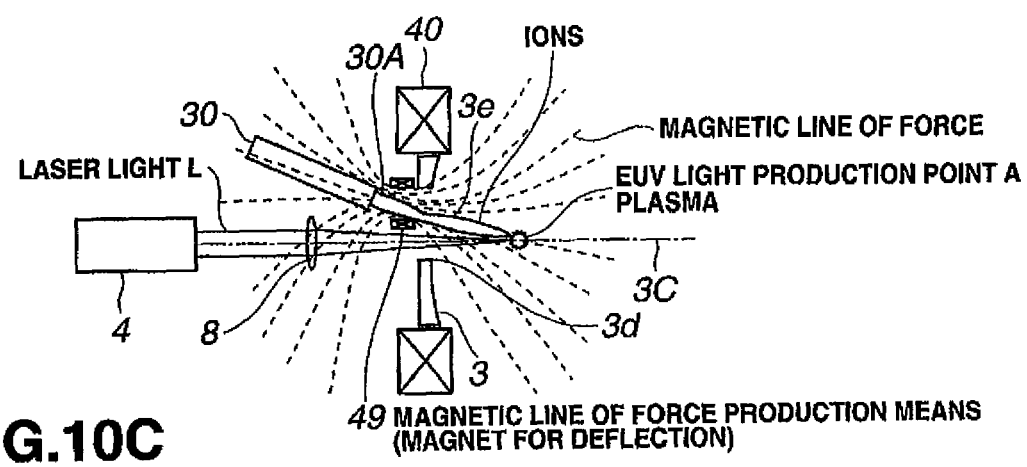

FIGS. 10A through 10C show configurations of an apparatus according to the fifth embodiment.

In the fifth embodiment, magnetic line of force production means 47, 48, and 49 for producing magnetic lines of force is provided in order to deflect the ions toward the entrance 30A of the ion withdrawal unit 30. In addition, the laser condenser system 8 and the magnet 40 are disposed such that the incident axis of the laser light L and the central axis of the magnetic field coincide or approximately coincide.

The apparatus shown in FIG. 10A is obtained by adding the magnet 47 for deflection to the apparatus of the above first embodiment.

In the first embodiment, the laser light axis is inclined at a predetermined angle with respect to the collector mirror center axis 3c. However, according to the fifth embodiment, the driver laser unit 4 and the laser condenser system 8 are disposed such that the laser light incidence axis and the collector mirror central axis 3c coincide or approximately coincide. On the other hands, the magnet 40 is disposed such that the magnetic field central axis and the collector mirror central axis 3c coincide or approximately coincide. Accordingly, the incident axis of the laser light L and the central axis of the magnetic field coincide or approximately coincide. The magnet 47 for deflection is provided for deflecting the high-speed ions to be withdrawn in order to avoid a collision of the high-speed ions against the laser condenser system 8. Correspondingly, the ion withdrawal unit 30 is disposed also to be inclined with respect to the laser light incidence axis.

The magnet 47 for deflection is provided on the opposite side of the collector mirror 3 from the EUV light production point A. The magnet 47 for deflection is also provided between the collector mirror 3 and the ion withdrawal unit 30. The central axis of the magnet 47 for deflection is shifted with respect to the central axis 3c of the collector mirror 3.

The magnet 47 is smaller than the main magnet 40, and is disposed so as to surround the laser light axis.

After passing through the collector mirror 3, the high-speed ions are deflected by the small magnet 47 for deflection, and are introduced into the entrance 30A of the ion withdrawal unit 30.

According to this embodiment, since the incident axis of the laser light and the collection axis (mirror central axis 3c) of the collector mirror 3 coincide or approximately coincide, alignment operation becomes easy. The ions are deflected after having passed through the collector mirror 3, and advance on or approximately on the laser light incidence axis at the time of passing through the collector mirror 3. Thus, the ion collection hole 3e and the laser passage hole 3d of the collector mirror 3 may be one and the same. As a result, an area (area of the reflective plane) for collecting light on the collector mirror 3 can be increased.

The apparatus shown in FIG. 10B comprises a core 48 for deflection in place of the magnet 47 for deflection of the apparatus shown in FIG. 10A. The arrangement of the core 48 is the same as that of the magnet 47 of the apparatus shown in FIG. 10A, and the operation and effect same as the apparatus shown in FIG. 10A can be obtained. Further, since the core is used in place of a magnet, the effect of simple structure and low cost can be obtained.

The apparatus shown in FIG. 10C comprises the small magnet 49 similar to the magnet 47 shown in FIG. 10A. It is, however, to be noted that the magnet 49 is disposed to deviate off the laser light axis. With the apparatus shown in FIG. 10C, the same operation and effect as the apparatus shown in FIG. 10A can be achieved. In addition, the laser light path is apart from the magnetic field, which brings about an effect that a small number of the high-speed ions leaked from the magnetic field can also be prevented from colliding against the laser condenser system 8.

(Sixth Embodiment)

Figure 11A:
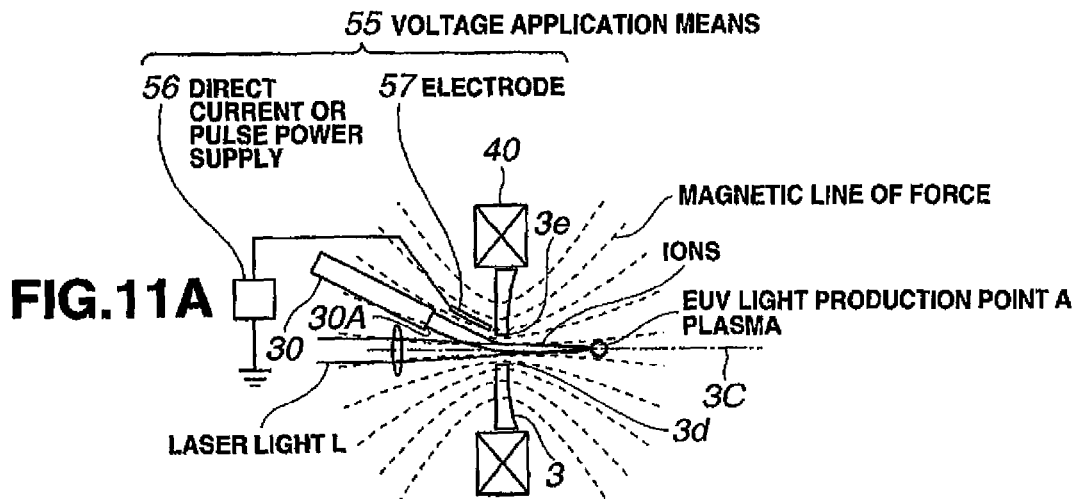
FIGS. 11A through 11C are views showing configurations of an apparatus according to a sixth embodiment.
Figure 11B:
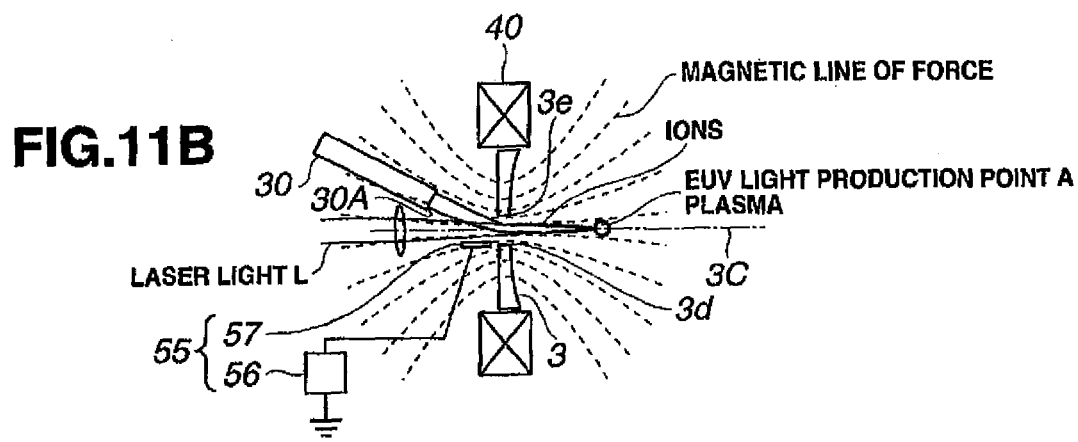
Figure 11C:
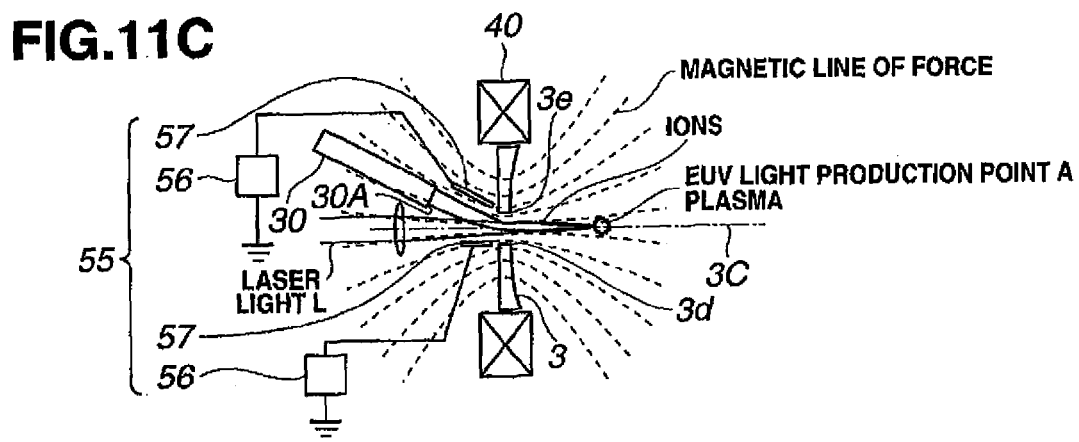

FIGS. 11A through 11C show configurations of an apparatus according to the sixth embodiment.

In the sixth embodiment, voltage application means 55 for applying a voltage on the ions is provided so as to deflect the ions toward the entrance 30A of the ion withdrawal unit 30. Also, like the fifth embodiment above, the laser condenser system 8 and the magnet 40 are disposed such that the incident axis of the laser light L and the central axis of the magnetic field coincide or approximately coincide.

The apparatus shown in FIGS. 11A through 11C is obtained by adding the voltage application means 55 for deflection to the apparatus of the above first embodiment.

In detail, the apparatus shown in FIGS. 11A through 11C is obtained by adding the voltage application means 55 comprising a direct current or pulse power supply 56 and an electrode 57 to the apparatus of the above first embodiment.

Like the fifth embodiment described above, the ion withdrawal unit 30 is disposed to be inclined with respect to the laser light incidence axis.

The electrode 57 is provided between the collector mirror 3 and the ion withdrawal unit 30. The electrode 57 is electrically connected with the direct current or pulse power supply 56.

In the apparatus shown in FIG. 11A, the direct current or pulse power supply 56 applies a voltage having a polarity opposite to that of the ions on the electrode 57. When the ions are charged particles having a plus polarity, a voltage having a minus polarity is applied. After passing through the collector mirror 3, the high-speed ions are deflected to be attracted toward the electrode 57 due to an electric field caused by the electrode 57 and then introduced into the entrance 30A of the ion withdrawal unit 30.

According to this embodiment, since the incident axis of the laser light and the collection axis (mirror central axis) of the collector mirror 3 coincide or approximately coincide, alignment operation becomes easy. Additionally, the ions are deflected after having passed through the collector mirror 3, and advance on or approximately on the laser light incidence axis at the time of passing through the collector mirror 3. Thus, the ion collection hole 3e and the laser passage hole 3d of the collector mirror 3 may be one and the same. Since the shape of the electrode 57 is adaptable as compared with that of a magnet, it is possible to increase the design flexibility and decrease the number of parts.

In the apparatus shown in FIG. 11B, the direct current or pulse power supply 56 applies a voltage having the same polarity as that of the ions on the electrode 57. When the ions are charged particles having a plus polarity, a voltage having a plus polarity is applied. After passing through the collector mirror 3, the high-speed ions are deflected to depart from the electrode 57 due to an electric field caused by the electrode 57 and then introduced into the entrance 30A of the ion withdrawal unit 30. According to this embodiment, the same effect as the apparatus shown in FIG. 11A can be obtained.

In the apparatus shown in FIG. 11C, the electrode 57 shown in FIG. 11A and the electrode 57 shown in FIG. 11B are provided, and the voltage having the polarity opposite to that of the ions like the apparatus shown in FIG. 11A and the voltage having the same polarity as that of the ions like the apparatus shown in FIG. 11B are respectively applied.

The direct current or pulse power supplies 56 and 56 apply a voltage having a polarity opposite to that of the ions and a voltage having the same polarity as that thereof on the electrodes 57 and 57, respectively. After passing through the collector mirror 3, the high-speed ions are deflected to be attracted toward one electrode 57 and to depart from the other electrode 57 due to an electric field caused by the electrodes 57 and 57, and then introduced into the entrance 30A of the ion withdrawal unit 30. According to this embodiment, the same effect as the apparatus shown in FIGS. 11A and 11B can be obtained.

Either a direct current voltage or a pulsed voltage may be available as a voltage applied on the electrode 57 by the direct current or pulse power supply 56. In detail, however, when the pulsed voltage is applied, there is an advantage that the collision of the ions against the electrode 57 can be prevented though the cost of the direct current or pulse power supply 56 is high, compared with the case where the direct current voltage is applied.

(Seventh Embodiment)

Figure 12:
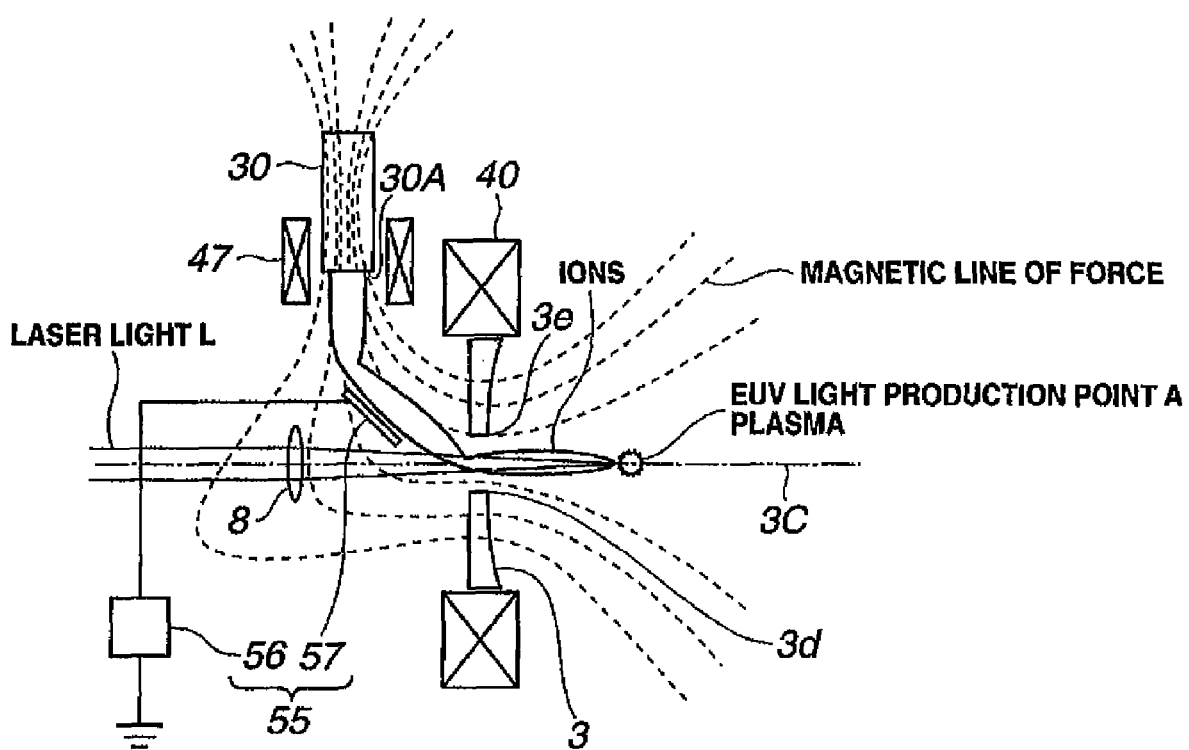
FIG. 12 is a view showing a configuration of an apparatus according to a seventh embodiment.

FIG. 12 shows a configuration of an apparatus according to the seventh embodiment.

The seventh embodiment is made by combining the fifth and sixth embodiments.

In the seventh embodiment, like the fifth embodiment, magnetic line production means 47 for producing magnetic lines of force is provided so as to deflect the ions toward the entrance 30A of the ion withdrawal unit 30. For example, the magnet 47 for deflection is provided like the apparatus shown in FIG. 10A.

Also, the voltage application means 55 for applying a voltage on the ions is provided so as to deflect the ions toward the entrance 30A of the ion withdrawal unit 30 as is the case with the sixth embodiment. For example, the direct current or pulse power supply 56 applies a voltage having the same polarity as that of the ions on the electrode 57 like the apparatus shown in FIG. 11B.

Further, like the fifth and sixth embodiments, the laser condenser system 8 and the magnet 40 are disposed such that the incident axis of the laser light L and the central axis of the magnetic field coincide or approximately coincide.

According to the seventh embodiment, after passing through the collector mirror 3, the high-speed ions are deflected so as to depart from the electrode 57 due to an electric field caused by the electrode 57. The ions are further deflected by the small magnet 47 for deflection and introduced into the entrance 30A of the ion withdrawal unit 30.

According to this embodiment, the same effects as the fifth and sixth embodiments can be obtained. In addition, since the high-speed ions are far strongly deflected, the damage caused by the collision of the high-speed ions against the laser condenser system 8 can be reduced.

(Eighth Embodiment)

Figure 13:
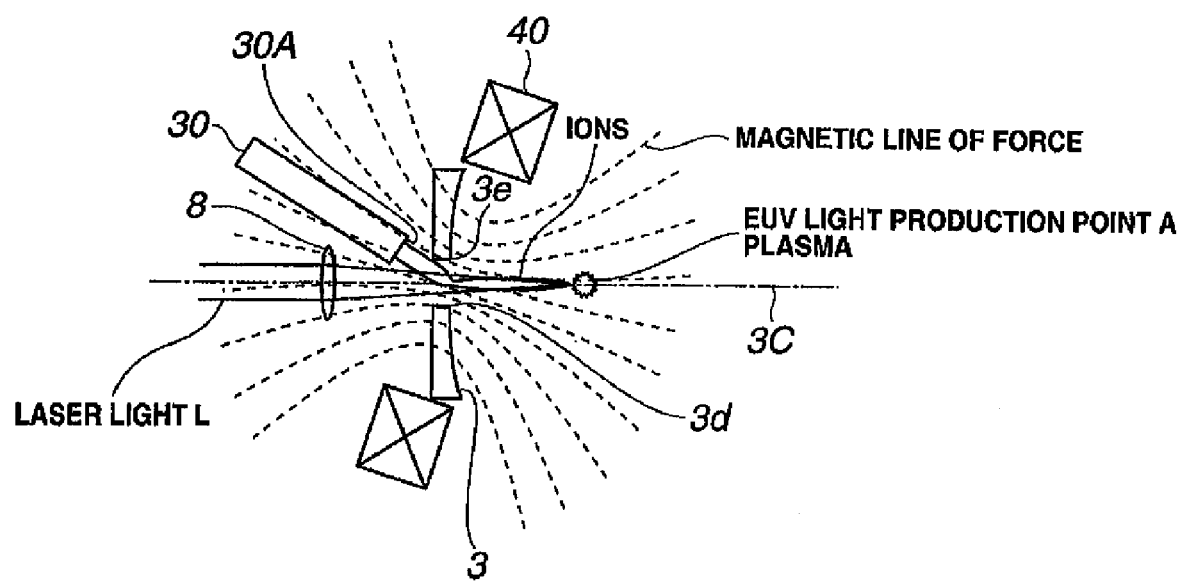
FIG. 13 is a view showing a configuration of an apparatus according to an eighth embodiment.

FIG. 13 shows a configuration of an apparatus according to the eighth embodiment.

The ions are made deflected by a magnetic field and/or an electric field in the fifth, sixth, and seventh embodiments described above. The magnetic lines of force may be deflected toward the entrance 30A of the ion withdrawal unit 30 by disposing the magnet 40 itself of the apparatus in the first embodiment to be inclined with respect to the collector mirror 3.

Specifically, as shown in FIG. 13, the magnet 40 is disposed so as to be inclined with respect to the collector mirror 3. It should be noted, however, that, in terms of a relationship with the laser condenser system 8, the magnet 40 is disposed such that the incident axis of the laser light L and the central axis of the magnetic field coincide or approximately coincide.

According to the eighth embodiment, the magnetic lines of force are deflected toward the entrance 30A of the ion withdrawal unit 30. Hence, after passing through the collector mirror 3, the high-speed ions are introduced into the entrance 30A of the ion withdrawal unit 30 along the deflected magnetic lines of force. Further, according to the eighth embodiment, there is an advantage that the configuration thereof can be simplified significantly though the collision of the ions against the laser condenser system 8 sometimes occurs.

(Ninth Embodiment)

Figure 14:
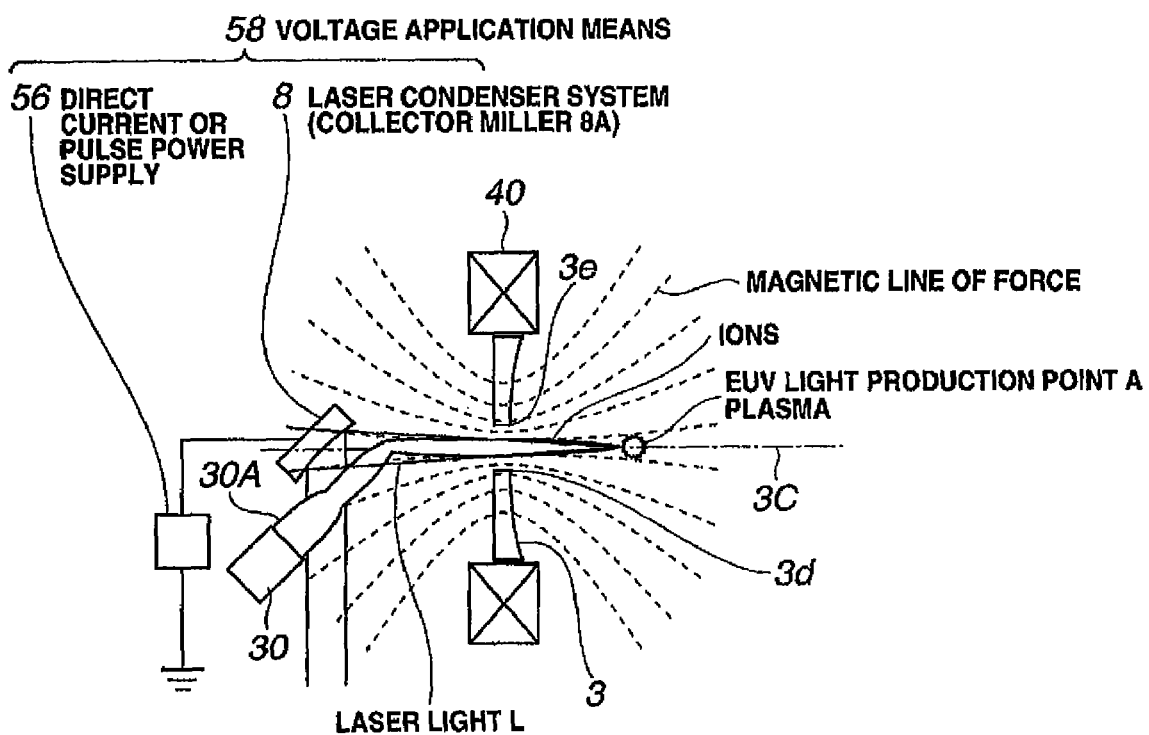
FIG. 14 is a view showing a configurations of an apparatus according to a ninth embodiment.

FIG. 14 shows a configuration of an apparatus according to the ninth embodiment.

In this embodiment, a collector mirror 8A is used as the laser condenser system 8. Further, when copper or the like is employed as the base metal of the collector mirror 8A, the collector mirror 8A acts as a deflection electrode having the same function as the electrode 57 of the sixth and seventh embodiments described above.

Specifically, in the ninth embodiment, voltage application means 58 for applying a voltage on the ions is provided so as to deflect the ions toward the entrance 30A of the ion withdrawal unit 30. Moreover, like the fifth, the sixth, the seventh, and the eighth embodiments described above, the laser condenser system 8 and the magnet 40 are disposed such that the incident axis of the laser light L and the central axis of the magnetic field coincide or approximately coincide.

The voltage application means 58 includes a direct current or pulse power supply 56 and the collector mirror 8A that functions as an electrode. The collector miller 8A is a constituent of the laser condenser system 8.

The ion withdrawal unit 30 is disposed so as to be inclined with respect to the laser light incidence axis, like the apparatus of the fifth, sixth, seventh, and eighth embodiments described above.

The collector mirror 8A is provided between the collector mirror 3 and the ion withdrawal unit 30. The collector mirror 8A is electrically connected with the direct current or pulse power supply 56.

In the apparatus shown in FIG. 14, the direct current or pulse power supply 56 applies a voltage having the same polarity as the ions on the collector mirror 8A. When the ions are charged particles having a plus polarity, a voltage having a plus polarity is applied. After passing through the collector mirror 3, the high-speed ions is deflected so as to depart from the collector mirror 8A due to an electric field caused by the collector mirror 8A and then introduced into the entrance 30A of the ion withdrawal unit 30.

According to the ninth embodiment, since the high-speed ions are deflected so as to depart from the collector mirror 8A, the collision of the ions against the collector mirror 8A can be suppressed. Further, since the laser light incidence axis, the central axis of the magnetic field, and the central axis 3c of the collector mirror 3 coincide, it is easy to adjust the alignment thereof with a simple configuration.

(Tenth Embodiment)

In each embodiment described above, the descriptions have been given on the assumption that a droplet target is employed as the target 1.

However, it may be possible to employ targets other than the droplet 1A as the target 1.

FIG. 15A shows a case in which a rotating disk target 1B is employed as the target 1. The rotating disk target 1B is made by lamination in which a target material such as tin Sn is coated on a surface 1e of a rotating disk.

EUV light is produced by emitting the laser light L on the rotating surface 1e of the rotating disk target 1B while the rotating disk target 1B is being rotated.

When the rotating disk target 1B is irradiated with the laser light L, the directivity of intensity distribution of the high-speed ions becomes strong as compared with a case where the droplet 1A is irradiated. Consequently, this makes the convergence of the high-speed ions easy, further enhancing the efficiency of collection and withdrawal.

FIG. 15B shows a case in which a grooved wire target 1C is employed as the target 1. The grooved wire target 1C is formed by a wire having a groove 1f in the longitudinal direction, and is made by lamination in which a target material such as tin Sn is coated on at least the groove 1f of the wire.

The EUV light is produced by emitting the laser light L on the groove 1f while the grooved wire target 1C is being moved in the longitudinal direction.

When the grooved wire target 1C is irradiated with the laser light L, the directivity of intensity distribution of the high-speed ions becomes far strong as compared with a case where the rotating disk target 1B is irradiated. Moreover the efficiency of conversion from laser energy to EUV light energy can be further enhanced. Additionally, the same effect can be also obtained by using a rotating disk having a groove thereon as the target 1.

FIG. 15C shows a case in which a hollowed wire target 1D is employed as the target 1. The hollowed wire target 1D is formed by a wire having hollows 1g formed at intervals in the longitudinal direction, and is made by lamination in which a target material such as tin Sn is coated on at least the hollows 1g of the wire.

When the hollowed wire target 1D is irradiated with the laser light L, the directivity of intensity distribution of the high-speed ions becomes far strong as compared with a case where the grooved wire target 1C is irradiated. Moreover, the efficiency of conversion from laser energy to EUV light energy can be further enhanced.

What is claimed is:

1. An ion withdrawal apparatus that withdraws ions emitted from a plasma in an EUV light production apparatus in which a target at an EUV light production point is irradiated with laser light to make a plasma state and the target emits EUV light, the ion withdrawal apparatus comprising:

a collector mirror that collects the EUV light and has a first hole for the ions to pass therethrough and a second hole for the laser light to pass therethrough;

first magnetic line of force production means that produces a magnetic line of force that is parallel or approximately parallel to the laser light incidence direction at the second hole; and ion withdrawal means that is disposed on the opposite side of the collector mirror from the EUV light production point and withdraws the ions via the first hole, wherein said first hole and said second hole are disposed to coincide or approximately coincide with a central axis of the collector mirror.

2. The ion withdrawal apparatus according to claim 1, further comprising:
   second magnetic line of force production means that further converges the magnetic line of force at an entrance of the ion withdrawal means to make a flux density higher.

3. The ion withdrawal apparatus according to claim 1, further comprising:
   voltage application means that applies a voltage on the ions to correct orbits of the ions at an entrance of the ion withdrawal means to introduce the ions into the entrance.

4. The ion withdrawal apparatus according to claim 1, further comprising:
   second magnetic line of force production means that produces the magnetic line of force so as to deflect the ions toward an entrance of the ion withdrawal means.

5. The ion withdrawal apparatus according to claim 1, further comprising:
   voltage application means that applies a voltage on the ions so as to deflect the ions toward an entrance of the ion withdrawal means.

6. The ion withdrawal apparatus according to claim 5, further comprising:
   a laser condenser system that condenses the laser light, the voltage being applied on the laser condenser system.

7. The ion withdrawal apparatus according to claim 6, wherein the laser condenser system and the first magnetic line of force production means are disposed such that an incident axis of the laser light and a central axis of a magnetic field coincide or approximately coincide.

8. The ion withdrawal apparatus according to claim 1, wherein the magnetic line of force is deflected toward an entrance of the ion withdrawal means by disposing the magnetic line of force so as to be inclined with respect to the collector mirror.

9. The ion withdrawal apparatus according to claim 1, wherein the target is a rotating disk target, a grooved wire target, or a hollowed wire target.

10. The ion withdrawal apparatus according to claim 1, further comprising:
    a laser condenser system for condensing the laser light, the laser condenser system including a lens.

11. A method of withdrawing ions emitted from a plasma in an EUV light production apparatus in which a target at an EUV light production point is irradiated with laser light to make a plasma state and the target emits EUV light, the method comprising:
    producing a magnetic line of force that is parallel or approximately parallel to a laser light incidence direction at a laser through hole provided to a collector mirror;
    allowing the magnetic line of force to trap the ions;
    moving the trapped ions along the magnetic line of force;
    passing the trapped ions via an ion collection hole provided to the collector mirror; and
    guiding the trapped ions toward an entrance of ion withdrawal means disposed on the opposite side of the collector mirror to withdraw the trapped ions, wherein said laser through hole and said ion collection hole are disposed to coincide or approximately coincide with a central axis of the collector mirror.

12. An ion withdrawal apparatus that withdraws ions emitted from a plasma in an EUV light production apparatus in which a target at an EUV light production point is irradiated with laser light to make a plasma state and the target emits EUV light, the ion withdrawal apparatus comprising:
    a collector mirror that collects the EUV light and has a hole for the ions and the laser light to pass therethrough;
    first magnetic line of force production means that produces a magnetic line of force that is parallel or approximately parallel to the laser light incidence direction at the hole; and
    ion withdrawal means that is disposed on the opposite side of the collector mirror from the EUV light production point and withdraws the ions via the hole, wherein
    said hole is disposed to coincide or approximately coincide with a central axis of the collector mirror.

13. The ion withdrawal apparatus according to claim 12, further comprising:
    second magnetic line of force production means that further converges the magnetic line of force at an entrance of the ion withdrawal means to make a flux density higher.

14. The ion withdrawal apparatus according to claim 12, further comprising:
    voltage application means that applies a voltage on the ions to correct orbits of the ions at an entrance of the ion withdrawal means to introduce the ions into the entrance.

15. The ion withdrawal apparatus according to claim 12, further comprising:
    second magnetic line of force production means that produces the magnetic line of force so as to deflect ions toward an entrance of the ion withdrawal means.

16. The ion withdrawal apparatus according to claim 12, further comprising:
    voltage application means that applies a voltage on the ions so as to deflect the ions toward an entrance of the ion withdrawal means.

17. The ion withdrawal apparatus according to claim 16, further comprising:
    a laser condenser system for condensing the laser light, the voltage being applied on the laser condenser system.

18. The ion withdrawal apparatus according to claim 17, wherein the laser condenser system and the first magnetic line of force production means are disposed such that an incident axis of the laser light and a central axis of a magnetic field coincide or approximately coincide.

19. The ion withdrawal apparatus according to claim 12, wherein the magnetic line of force is deflected toward an entrance of the ion withdrawal means by disposing the magnetic line of force so as to be inclined with respect to the collector mirror.

20. The ion withdrawal apparatus according to claim 12, wherein the target is a rotating disk target, a grooved wire target, or a hollowed wire target.

21. The ion withdrawal apparatus according to claim 12, further comprising:
    a laser condenser system for condensing the laser light, the laser condenser system including a lens.

* * * * *